(12) United States Patent
Wang et al.

(10) Patent No.: US 7,992,120 B1
(45) Date of Patent: Aug. 2, 2011

(54) CONGESTION ESTIMATION FOR PROGRAMMABLE LOGIC DEVICES

(75) Inventors: Xinyu Wang, Shanghai (CN); Bo Wang, Shanghai (CN)

(73) Assignee: Lattice Semiconductor Corporation, Hillsboro, OR (US)

( * ) Notice: Subject to any disclaimer, the term of this patent is extended or adjusted under 35 U.S.C. 154(b) by 370 days.

(21) Appl. No.: 12/323,974

(22) Filed: Nov. 26, 2008

(51) Int. Cl.
*G06F 17/50* (2006.01)

(52) U.S. Cl. .......................... 716/128; 716/116; 370/237

(58) Field of Classification Search .................. 716/116, 716/128; 370/237
See application file for complete search history.

(56) References Cited

U.S. PATENT DOCUMENTS

| | | | |
|---|---|---|---|
| 5,598,343 A * | 1/1997 | Roy et al. ...................... | 716/128 |
| 5,648,913 A | 7/1997 | Bennett et al. | |
| 5,659,484 A | 8/1997 | Bennett et al. | |
| 6,813,754 B2 | 11/2004 | Wu et al. | |
| 6,952,815 B2 * | 10/2005 | Teig et al. ...................... | 716/129 |
| 7,013,445 B1 * | 3/2006 | Teig et al. ...................... | 716/123 |
| 7,076,406 B1 * | 7/2006 | Tetelbaum ........................ | 703/2 |
| 7,143,378 B1 | 11/2006 | Nag | |
| 7,146,590 B1 * | 12/2006 | Chaudhary ................... | 716/113 |
| 7,210,115 B1 | 4/2007 | Rahim et al. | |
| 2008/0115099 A1 * | 5/2008 | Patra ................................ | 716/13 |
| 2009/0144688 A1 * | 6/2009 | Uchino et al. ................... | 716/12 |

OTHER PUBLICATIONS

Sherwani, Naveed, Algorithms for VLSI Physical Design Automation, Second Edition, 1995, pp. 177-186.
Chih-liang Eric Cheng, RISA: Accurate and Efficient Placement Routability Modeling, ACM, 1994, pp. 690-695.
Li et al., Routability-Driven Placement and White Space Allocation, IEEE, 2004, pp. 394-401.
Wang et al., Congestion Minimization During Placement, IEEE Transactions on Computer-Aided Design of Integrated Circuits and Systems, vol. 19, No. 10, Oct. 2000, pp. 1140-1148.
Kirkpatrick et al., Optimization by Simulated Annealing, Science, vol. 220, No. 4598, May 13, 1983, pp. 671-680.
Parthasarathy et al., Interconnect Complexity-Aware FPGA Placement Using Rent's Rule, ACM, Mar. 31, 2001, pp. 115-121.
Yeager et al., Congestion Estimation and Localization in FPGAs: A Visual Tool for Interconnect Prediction, ACM, Mar. 17, 2007, pp. 33-40.
Zhuo et al., A Congestion Driven-Placement Algorithm for FPGA Synthesis, Department of Computer Science and Engineering, University of North Texas, 4 pages.
Cong et al., Large-Scale Circuit Placement: Gap and Promise, Proceedings of the International Conference on Computer Aided Design (ICCAD'03), ACM, 2003, pp. 883-890.
Kong, Tim, A Novel Net Weighting Algorithm for Timing-Driven Placement, IEEE, 2002, pp. 172-176.
Ren et al., Sensitivity Guided Net Weighting for Placement Driven Synthesis, ACM, 2004, pp. 10-17.
Zhuo et al., New Timing and Routability Driven Placement Algorithms for FPGA Synthesis, ACM, 2007, pp. 570-575.
Kannan et al., On Metrics for Comparing Routability Estimation Methods for FPGAs, ACM, Jun. 10, 2002, 6 pages.
Lou et al., Estimating Routing Congestion using Probabilistic Analysis, ACM, Apr. 1, 2001, pp. 112-117.

* cited by examiner

*Primary Examiner* — Naum Levin
(74) *Attorney, Agent, or Firm* — Haynes and Boone, LLP

(57) ABSTRACT

Various techniques are provided for estimating signal congestion in a programmable logic device (PLD). In one example, a computer-implemented method of estimating signal congestion in routing resources of a PLD is provided. The routing resources comprise a plurality of nodes and a plurality of wires which may be selectively interconnected to provide a plurality of signal paths through the routing resources of the PLD. The method includes determining a plurality of wire congestion values. Each of the wire congestion values identifies a relative likelihood of a corresponding one of the wires being used to provide the signal paths in comparison with the other wires. The method also includes selecting a region of the routing resources. The method further includes determining a congestion density estimate for the region using the wire congestion values associated with the wires of the region.

13 Claims, 22 Drawing Sheets

CONGESTION ESTIMATION FOR PROGRAMMABLE LOGIC DEVICES

TECHNICAL FIELD

The present invention relates generally to programmable logic devices and, more particularly for example, to congestion estimation techniques for programmable logic devices.

BACKGROUND

Programmable logic devices (PLDs), such as field programmable gate arrays (FPGAs) or complex programmable logic devices (CPLDs), may be configured to provide user-defined features. PLDs typically include various components, such as programmable logic cells, memory cells, digital signal processing cells, input/output cells, and other components. The PLD components may be interconnected through signal paths provided by routing wires of the PLD to implement a desired circuit design.

However, PLDs typically have a limited supply of routing wires available to interconnect components from different portions of the PLD. This differs from conventional application-specific integrated circuits (ASICs) in which empty physical spaces may be reserved to implement additional signal paths at a later time if desired. Thus, if a given circuit design requires too many signals to be interconnected between certain regions of a PLD, the limited number of available wires may become nearly or completely exhausted, leading to congestion in the PLD signal paths.

Unfortunately, existing approaches to determining PLD congestion are often unsatisfactory. For example, conventional approaches to congestion estimation typically assume that signal paths will be uniformly routed throughout the available routing resources between source and destination locations of the PLD. In this regard, such approaches assume that if there are several possible signal paths between a source and destination, then all of the signal paths will be equally likely to actually be used to carry the signal from the source to destination.

As a result, such approaches may underestimate signal congestion along signal paths that are frequently selected by routing processes, and overestimate signal congestion along signal paths that less frequently selected. Accordingly, there is a need for an improved approach to estimating signal congestion in PLDs.

SUMMARY

In accordance with one embodiment of the present invention, a computer-implemented method of estimating signal congestion in routing resources of a programmable logic device (PLD) is provided. The routing resources comprise a plurality of nodes and a plurality of wires which may be selectively interconnected to provide a plurality of signal paths through the routing resources of the PLD. The method includes determining a plurality of wire congestion values, wherein each of the wire congestion values identifies a relative likelihood of a corresponding one of the wires being used to provide the signal paths in comparison with the other wires; selecting a region of the routing resources; and determining a congestion density estimate for the region using the wire congestion values associated with the wires of the region.

In accordance with another embodiment of the present invention, a computer-implemented method of determining probability values associated with routing resources of a programmable logic device (PLD) is provided. The routing resources comprise a plurality of nodes and a plurality of wires which may be selectively interconnected to provide a plurality of signal paths through the routing resources to connect a source node to at least one destination node of the PLD. The method includes selecting a first subset of the routing resources, wherein the first subset may be used to provide at least a portion of one of the signal paths from the source node to the destination node, wherein the first subset comprises a root node, a trunk node, and a trunk wire connecting the root node to the trunk node; determining a plurality of intermediate probability values associated with the trunk wire, wherein each intermediate probability value identifies a probability of the trunk wire being used by any of the signal paths that also include a corresponding one of the other wires of the routing resources connected between the trunk wire and the source node; and summing the intermediate probability values associated with the trunk wire to determine a source/destination probability value associated with the trunk wire, wherein the source/destination probability value identifies a probability of the trunk wire being used to connect the source node to the destination node.

In accordance with another embodiment of the present invention, a system includes one or more processors; and one or more memories adapted to store a plurality of computer readable instructions which when executed by the one or more processors are adapted to cause the system to perform a computer-implemented method of estimating signal congestion in routing resources of a programmable logic device (PLD), wherein the routing resources comprise a plurality of nodes and a plurality of wires which may be selectively interconnected to provide a plurality of signal paths through the routing resources of the PLD, the method includes determining a plurality of wire congestion values, wherein each of the wire congestion values identifies a relative likelihood of a corresponding one of the wires being used to provide the signal paths in comparison with the other wires, selecting a region of the routing resources, and determining a congestion density estimate for the region using the wire congestion values associated with the wires of the region.

In accordance with another embodiment of the present invention, a system includes one or more processors; and one or more memories adapted to store a plurality of computer readable instructions which when executed by the one or more processors are adapted to cause the system to perform a computer-implemented method of determining probability values associated with routing resources of a programmable logic device (PLD), wherein the routing resources comprise a plurality of nodes and a plurality of wires which may be selectively interconnected to provide a plurality of signal paths through the routing resources to connect a source node to at least one destination node of the PLD, the method includes selecting a first subset of the routing resources, wherein the first subset may be used to provide at least a portion of one of the signal paths from the source node to the destination node, wherein the first subset comprises a root node, a trunk node, and a trunk wire connecting the root node to the trunk node, determining a plurality of intermediate probability values associated with the trunk wire, wherein each intermediate probability value identifies a probability of the trunk wire being used by any of the signal paths that also include a corresponding one of the other wires of the routing resources connected between the trunk wire and the source node, and summing the intermediate probability values associated with the trunk wire to determine a source/destination probability value associated with the trunk wire, wherein the source/destination probability value identifies a probability of the trunk wire being used to connect the source node to the destination node.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
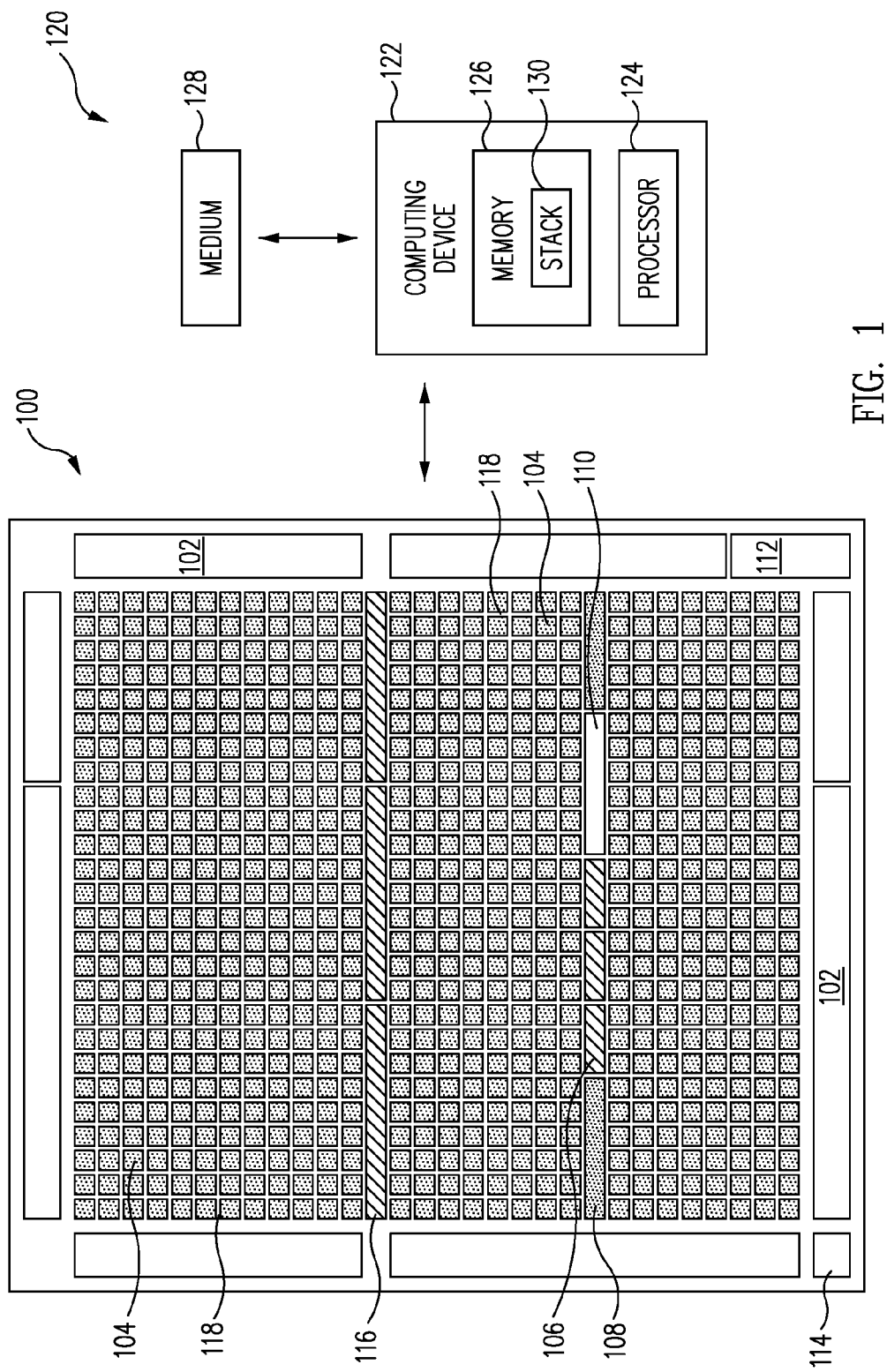
FIG. 1 illustrates a block diagram of a programmable logic device (PLD) and a system for generating configuration data for use with the PLD in accordance with an embodiment of the invention.

In accordance with various techniques described herein, signal congestion in a PLD can be estimated in a manner that accounts for the probabilities associated with individual wires of routing resources of the PLD. In one embodiment, routing resources of a PLD may include a plurality of nodes and a plurality of wires. In this regard, the wires are wires of routing resources of the PLD (e.g., segmented wires) which may be used to route signals through the PLD. The nodes are reference points in the PLD routing resources which are used by various root-branch model representations further described herein. In one embodiment, the nodes are reference points implemented by switches or interface blocks to connect the wires with other wires or other PLD components such as logic blocks. In another embodiment, the nodes are reference points along the wires themselves (e.g., where an intermediate location along a continuous wire is referenced).

The routing resources may be selectively interconnected to provide possible signal paths between source and destination nodes of the PLD (e.g., to provide possible signal paths between a component of the PLD at the source node, and another component of the PLD at the destination node).

These signal paths may be conceptually represented using subsets of the routing resources that include one or more "root nodes," "trunks," and "branch wires." A root node corresponds to one of the nodes selected to be used as a reference point relative to the other nodes and wires. A trunk corresponds to a wire extending from the root node in a given direction (e.g., typically in a horizontal or vertical direction). The trunk may further include one or more additional wires and nodes. The additional wires may be appended to the first wire of the trunk in a serial fashion through the additional nodes of the trunk. Any of the wires included in the trunk may also be referred to as "trunk wires." The number of wires in the trunk connected in serial fashion correspond to a "trunk length" as will be further described herein. In one embodiment, the number of wires may be limited to a "maximum trunk length" as also further described herein. Any of the additional nodes included in the trunk may also be referred to as "trunk nodes." A branch wire corresponds to a wire which may be connected to the trunk to provide part of a signal path from the root node, through the trunk, and through the branch wire. Additional details of these conceptual representations (also referred to as a root-branch model) will be further described herein.

Each wire in the routing resources of the PLD may have one or more source/destination probability values which identify the probability that the wire may be used as part of various signal paths to connect source nodes with destination nodes. For example, a wire may have a first source/destination probability value associated with a first set of source/destination nodes, and may also have a second source/destination probability value associated with a second set of source/destination nodes.

For each wire, all of its associated source/destination probability values may be summed, combined, or otherwise used together to determine a wire congestion value. The wire congestion value may be used to identify the likelihood that the wire will be used by signal paths of the PLD relative to other wires of the routing resources.

Based on the wire congestion values, possible regions of signal congestion in the PLD may be identified. For example, if wires in a particular region of the PLD have large wire congestion values, this may indicate that such wires are likely to be used by signal paths of the PLD. As a result, the region may exhibit significant signal congestion.

FIG. 1 illustrates a block diagram of a programmable logic device (PLD) 100 and a system 120 for generating configuration data for use with PLD 100 in accordance with an embodiment of the invention. In one embodiment, PLD 100 may be implemented as a PLD in the ECP2/M family of devices available from Lattice Semiconductor Corporation of Hillsboro, Oreg.

PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

System 120 includes a computing device 122 and a computer readable medium 128. As shown, computing device 122 includes a processor 124 and a memory 126. Processor 124 may be configured with appropriate software (e.g., a computer program for execution by a computer) that is stored on computer readable medium 128 and/or in memory 126 to instruct processor 124 to perform one or more of the operations described herein. In one embodiment, such software may be implemented as ispLEVER 7.1 software available from Lattice Semiconductor Corporation of Hillsboro, Oreg.

System 120 also includes a stack 130 which may be maintained in memory 126 or any other appropriate location. Stack 130 may be implemented, for example, as a last in, first out (LIFO) data structure that may be used in various embodiments as further described herein.

Processor 124 and memory 126 may be implemented in accordance with any appropriate components that may be used to provide computing system 120. Similarly, computer readable medium 128 may be implemented using any appropriate type of machine-readable medium used to store software. System 120 may be implemented to provide configuration data prepared by system 120 to PLD 100 through, for example, configuration port 112.

Figure 2:
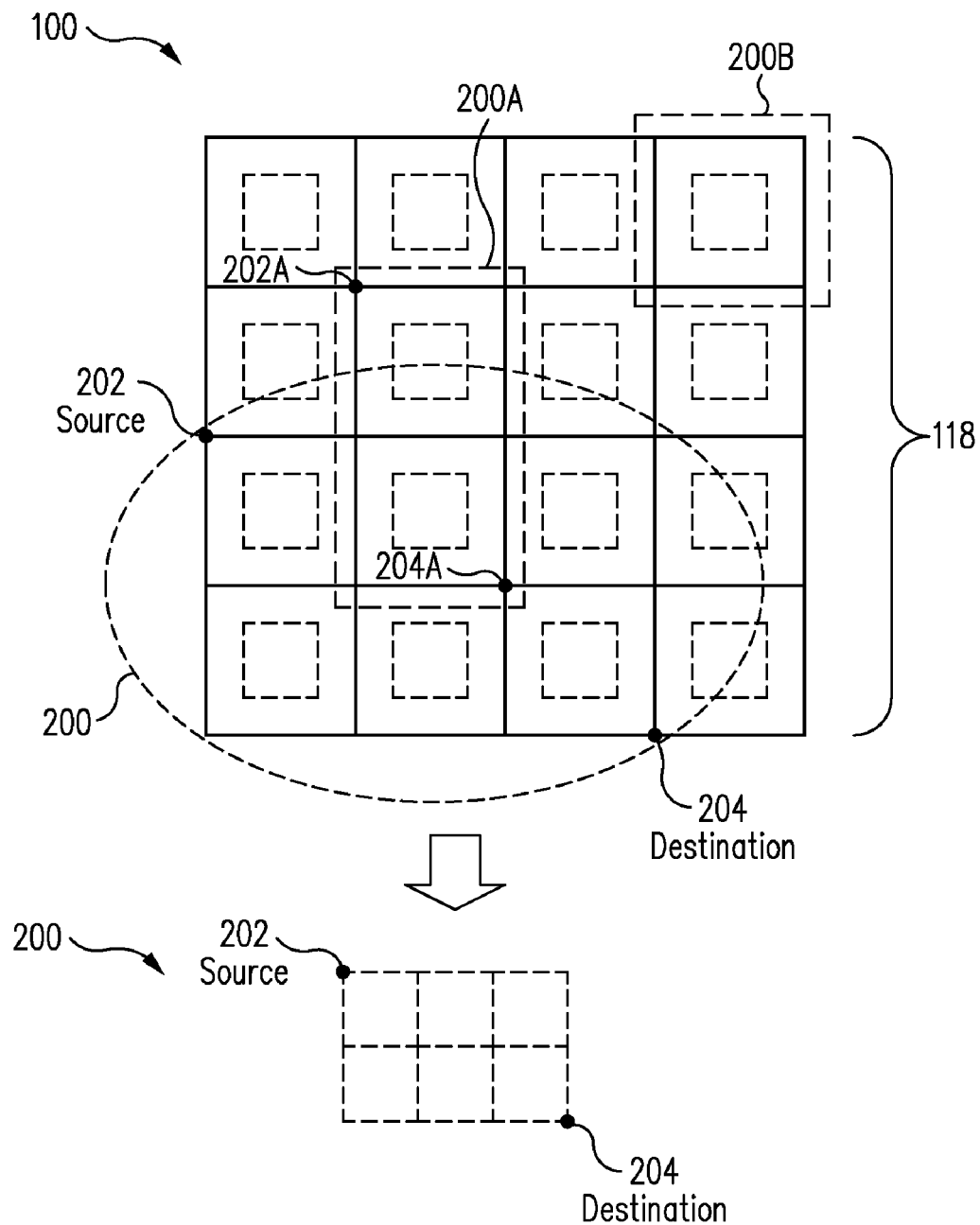
FIG. 2 illustrates a PLD with routing resources partitioned into a grid in accordance with an embodiment of the present invention.

FIG. 2 illustrates PLD 100 with routing resources 118 partitioned into a grid in accordance with an embodiment of the present invention. In this regard, a portion 200 of routing resources 118 may be used to connect a source node 202 with a destination node 204. Source node 202 and destination node 204 may provide, for example: connections between wires and components of PLD 100 (e.g., logic blocks 104 or other components of PLD 100 previously identified); or connections between wires of PLD 100.

Figure 3:
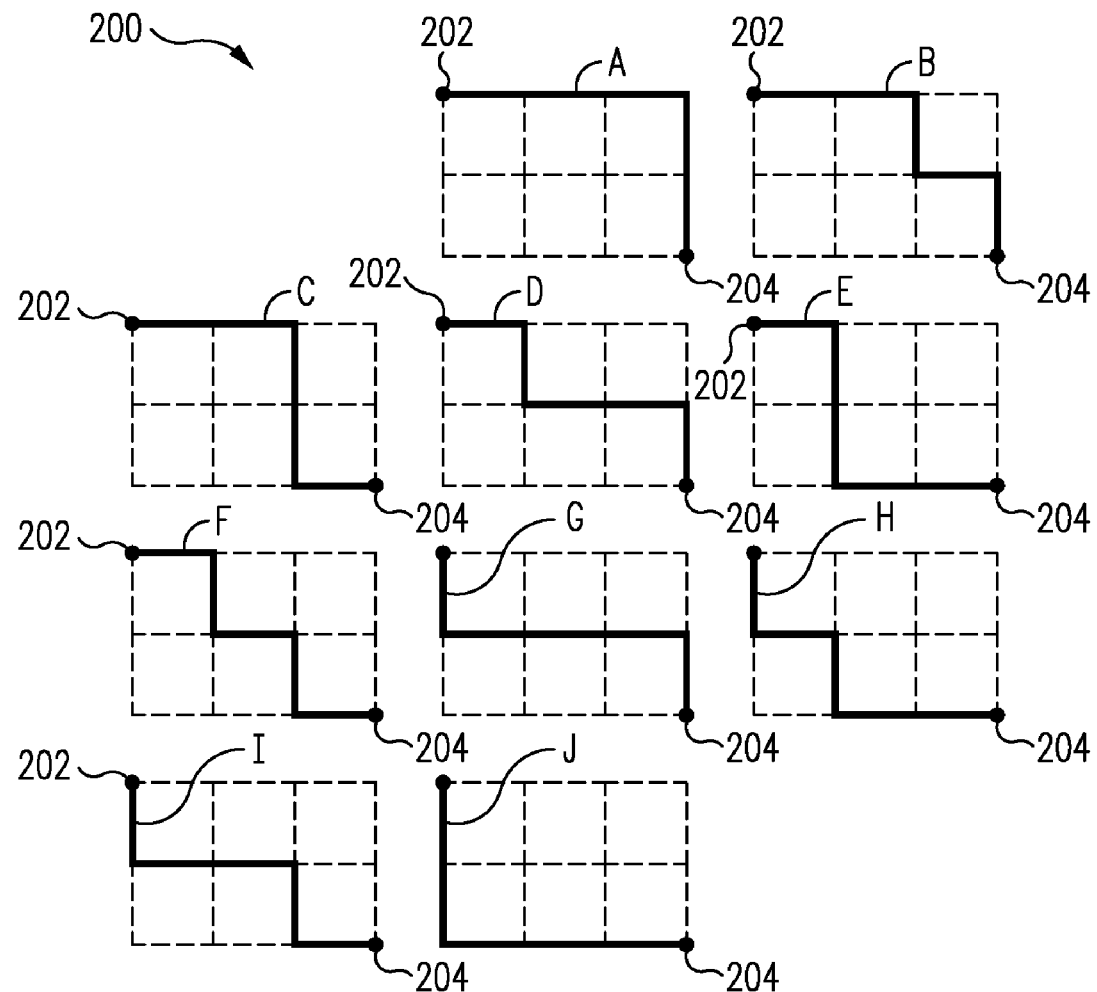
FIG. 3 illustrates a plurality of possible signal paths through routing resources of a PLD in accordance with an embodiment of the present invention.
Figure 4:
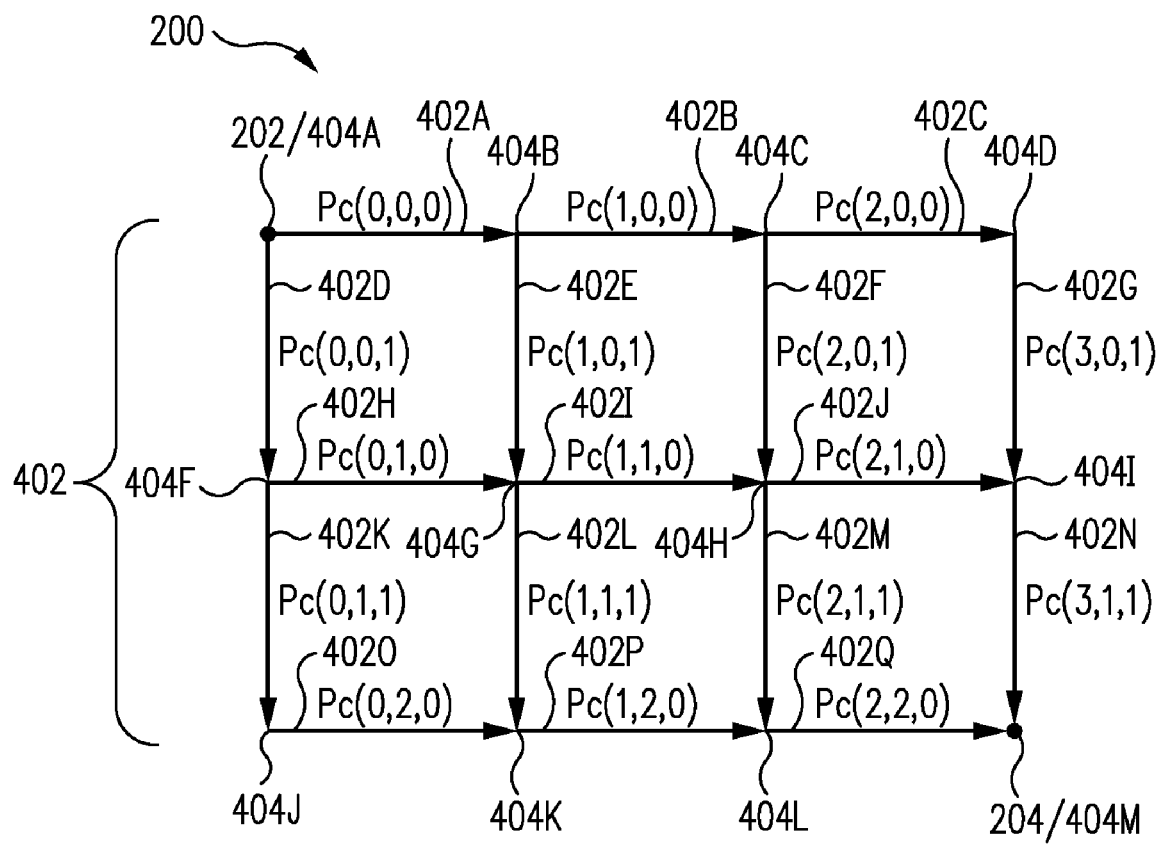
FIG. 4 illustrates individual wires of routing resources of a PLD in accordance with an embodiment of the present invention.

Source node 202 and destination node 204 may be connected by portion 200 through a variety of different possible signal paths A-J which are illustrated in FIG. 3. FIG. 4 provides further details of portion 200 of routing resources 118. In this regard, portion 200 includes wires 402 (e.g., 17 wires that are denoted by the arrows shown in FIG. 4). In view of FIGS. 3 and 4, it will be appreciated that individual wires 402 may be connected together to provide signal paths A-J to connect source node 202 with destination node 204.

As further described herein, a source/destination probability value may be determined for each wire of portion 200. These source/destination probability values identify the probability that a given wire will be used to connect source node 202 with destination node 204.

FIG. 2 also illustrates a source node 202A and a destination node 204A which may be connected by portion 200A of routing resources 118. Each wire of portion 200A may also have an associated source/destination probability value identifying the probability that a given wire will be used to connect source node 202A with destination node 204A. FIG. 2 further also illustrates a portion 200B of routing resources 118 which will be further described herein.

Wires included in both of portions 200 and 200A (e.g., wires 402B, 402E, 402F, and 402I shown in FIG. 4) will each have two associated source/destination probability values (e.g., one source/destination probability value associated with signal paths connecting nodes 202/204, and another source/destination probability value associated with signal paths connecting nodes 202A/204A.

In one embodiment, all source/destination probability values associated with a given wire can be summed together to obtain a congestion density estimate for the wire. Thus, wires included in both of portions 200 and 200A will likely exhibit a higher congestion density estimate than wires included in only one of portions 200 or 200A. Similarly, wires included in portion 200 or 200A will likely exhibit a higher congestion density estimate than wires that are not included in either of portions 200 or 200A (e.g., at least some wires in portions 200 or 200A will have non-zero source/destination probability values, while wires outside of portions 200 or 200A will have source/destination probability values of zero).

As further shown in FIG. 4, each one of wires 402 has an associated source/destination probability value represented in the form Pc(i,j,k), where i and j identify the relative position of each wire 402, and k indicates the horizontal (k=0) or vertical (k=1) orientation of each wire 402. For a given one of wires 402, its corresponding source/destination probability value Pc(i,j,k) identifies the probability that the wire 402 will be used by any of the possible signal paths A-J that may be used to connect source node 202 with destination node 204 (e.g., all possible signal paths A-J that may include the wire 402 are considered in determining its source/destination probability value Pc(i,j,k)).

Additional probability values may also be used in accordance with various embodiments described herein. For example, as further described herein, the source/destination probabilities associated with all signal paths of a PLD configuration for each wire may be added together to provide a wire congestion value Pd(i,j,k) for each wire. The wire congestion value may be used to identify the likelihood that the wire will be used by signal paths of the PLD relative to other wires of the routing resources 118 when all signals connecting all combinations of source and destination nodes of routing resources 118 of PLD 100 are considered.

Intermediate probability values P1, P2, ... PX refer to the probability that a given wire 402 will be used by any of the possible signal paths A-J that also include one or more other intermediate wires connected between the given wire and the source node (e.g., source node 202 or 202A). For example, upon inspection of FIGS. 3 and 4, it will be appreciated that wire 402E may be used by any of signal paths D, E, or F. However, only signal paths D and F will use both of wires 402I and 402E. Thus, as further described herein, intermediate probability value P1 may be used to identify the probability that wire 402I will be used by a signal path that includes intermediate wire 402E (e.g., used by at least one of signal paths D, E, or F), while source/destination probability value Pc(1,1,0) may be used to identify the probability that the wire 402I will be used by at least one of any of the possible signal paths A-J.

Branch probability values of the form $P_{BY\_Z}$ will be further described herein which identify the probabilities that different branch wires may be used by a signal path that reaches a particular node. For example, if two branch wires connect to a single node, then branch probability values $P_{B2\_1}$ and $P_{B2\_2}$ may be used to identify the probabilities of the first or second branch wires will be used by a signal path passing through the node. As another example, if three branch wires connect to a single node, then branch probability values $P_{B3\_1}$, $P_{B3\_2}$, and $P_{B3\_3}$ may be used to identify the probability that the first, second, or third branch wires will be used by a signal path passing through the node.

Figure 5A:
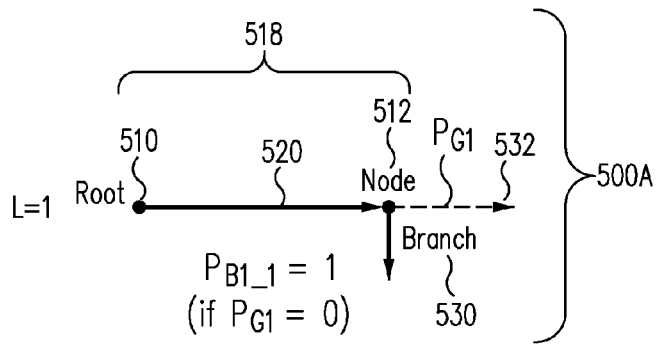
FIGS. 5A-C illustrate subsets of routing resources in accordance with embodiments of the present invention.
Figure 5B:
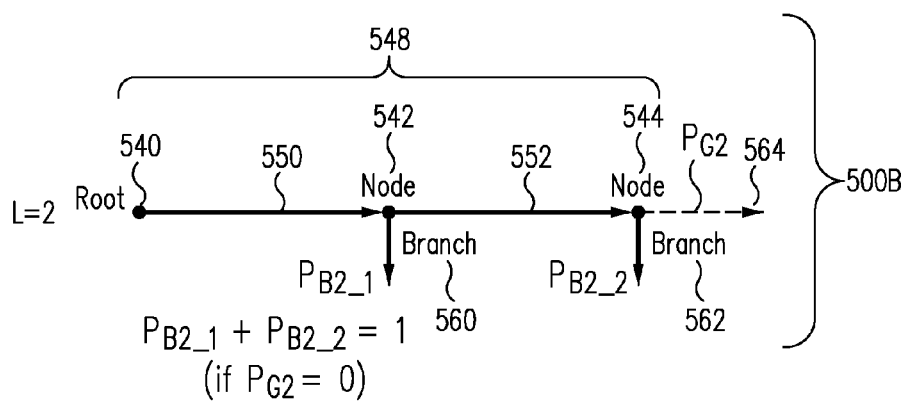
Figure 5C:
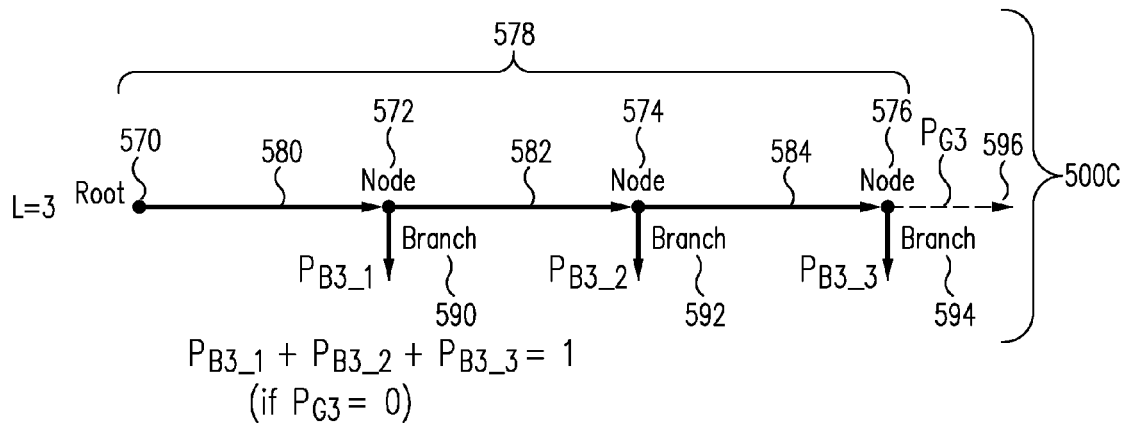

FIGS. 5A-C illustrate several conceptual representations of routing resources 118 using root nodes, trunks, and branch wires corresponding to subsets of routing resources 118. FIG. 5A shows a subset 500A of routing resources 118. A root node 510 is shown connected to a trunk 518 that includes a wire 520 and a node 512. A branch wire 530 is connected to trunk 518 through node 512. Because trunk 518 includes only a single wire 520, subset 500A is identified as having a length L=1.

Branch wire 530 is associated with a branch probability value $P_{B1\_1}$ which corresponds to the probability that branch wire 530 will be selected as part of the signal path that passes through node 512. In the example shown in FIG. 5A, only a single branch wire 530 is connected to wire 520 through node 512. Accordingly, probability $P_{B1\_1}$ in this example will correspond to a value of 1.

FIG. 5B shows a subset 500B of routing resources 118. A root node 540 is shown connected to a trunk 548 that includes wires 550 and 552 and nodes 542 and 544. A branch wire 560 is connected to trunk 548 through node 542, and another branch wire 562 is connected to trunk 548 through node 544. Because trunk 548 includes wires 550 and 552, subset 500B is identified as having a length L=2.

As shown in FIG. 5B, branch wires 560 and 562 are associated with branch probability values $P_{B2\_1}$ and $P_{B2\_2}$, respectively, which correspond to probabilities that branch wires 560 and 562 will be selected as part of the signal path that passes through node 542. Because any signal path passing through node 542 will pass through either branch wire 560 or 562, the sum of probabilities $P_{B2\_1}$ and $P_{B2\_2}$ is 1.

FIG. 5C shows a subset 500C of routing resources 118. A root node 570 is shown connected to a trunk 578 that includes wires 580, 582, and 584, and nodes 572, 574, and 576. A branch wire 590 is connected to trunk 578 through node 572, another branch wire 592 is connected to trunk 578 through node 574, and yet another branch wire 594 is connected to trunk 578 through node 576. Because trunk 578 includes wires 580, 582, and 584, subset 500C is identified as having a length L=3.

As shown in FIG. 5C, branch wires 590, 592, and 594 are associated with branch probability values $P_{B3\_1}$, $P_{B3\_2}$ and $P_{B3\_3}$, respectively, which correspond to probabilities that branch wires 590, 592, and 594 will be selected as part of the signal path that passes through node 572. Because any signal path passing through node 572 will pass through branch wire 590, 592, or 594, the sum of probabilities $P_{B3\_1}$, $P_{B3\_2}$, and $P_{B3\_3}$ is 1.

Probabilities $P_{B2\_1}$, $P_{B2\_2}$, $P_{B3\_1}$, $P_{B3\_2}$, and $P_{B3\_3}$ may be determined, for example, by appropriate benchmark testing of existing PLD configurations. In this regard, in one embodiment, a developer (or appropriate software of system 120) may determine the likelihood that a signal path will be assigned to one of several possible branch wires (e.g., assigned to a first or a second branch wire in the case of subset 500B, or assigned to a first, a second, or a third branch wire in the case of subset 500C) and assign values to the probabilities accordingly.

In another embodiment, the likelihood of taking each possible branch wire may be assumed to be equal. In this embodiment, $P_{B2\_1}$ and $P_{B2\_2}$ may each be assigned a probability value of 0.5, and $P_{B3\_1}$, $P_{B3\_2}$, and $P_{B3\_3}$ may each be assigned a probability value of approximately 0.3 (e.g., ⅓).

As shown in FIGS. 5A-C, new subsets including wires 532, 564, and 596 (shown in broken lines) may be connected to nodes 512, 544, and 576 of original subsets 500A, 500B, and 500C. Such new subsets may be implemented, for example, where: (1) an original subset does not include a branch wire; or (2) an original subset has been implemented using a maximum trunk length, as will be further described herein.

Wires 532, 564, and 596 of the new subsets may have branch probability values of PG1, PG2, and PG3, respectively, when connected to nodes 512, 544, and 576. In such embodiments, branch probability values of PG1, PG2, and PG3 may be nonzero to account for the probability that a signal may propagate through such wires. However, in embodiments where wires 532, 564, and 596 are not connected, then branch probability values of PG1, PG2, and PG3 will be zero.

Subsets of routing resources 118 may be selected (e.g., identified) in accordance with various rules. In accordance with a first rule in one embodiment, a subset having a trunk length of 1 may be selected where only a single branch wire is connected to the first non-root node of the trunk. For example, such a rule may be used to select subsets 628, 634, and 636 of FIGS. 6B and 6F further described herein.

In accordance with a second rule in another embodiment, a subset may be selected having a trunk length determined by the distance required to extend a signal path to reach a destination node. For example, such a rule may be used to select subsets 620, 624, 630, 632, and 638_of FIGS. 6B, 6C, 6D, and 6F_further described herein. When this second rule is applied, the trunk length may range from a length of 1 up to a length less than or equal to a maximum trunk length. In this regard, system 120 may be configured to process subsets having trunk lengths no longer than the maximum trunk length. If a signal path is required to extend beyond the maximum trunk length, then additional subsets may be selected in accordance with a third rule further described herein.

In accordance with a third rule in another embodiment, a subset having a maximum trunk length may be selected. In this regard, if a possible signal path extends in a given direction longer than a maximum trunk length, then one or more trunks extending in the same direction may be appended together. In this regard, a trunk having a length of one or more wires (e.g., up to the maximum trunk length) may be appended to one or more other trunks having the maximum trunk length to extend a signal path.

Figure 5D:
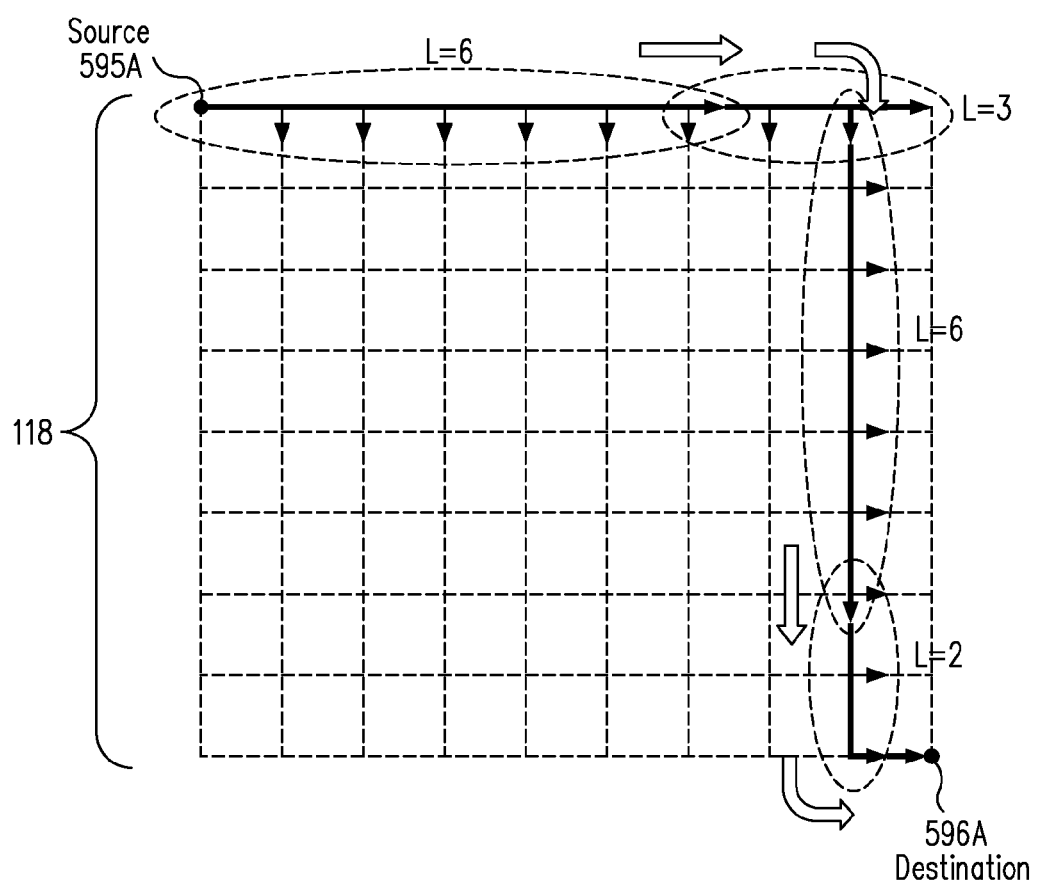
FIGS. 5D-E illustrate additional examples of a PLD with routing resources partitioned into grids in accordance with embodiments of the present invention.
Figure 5E:
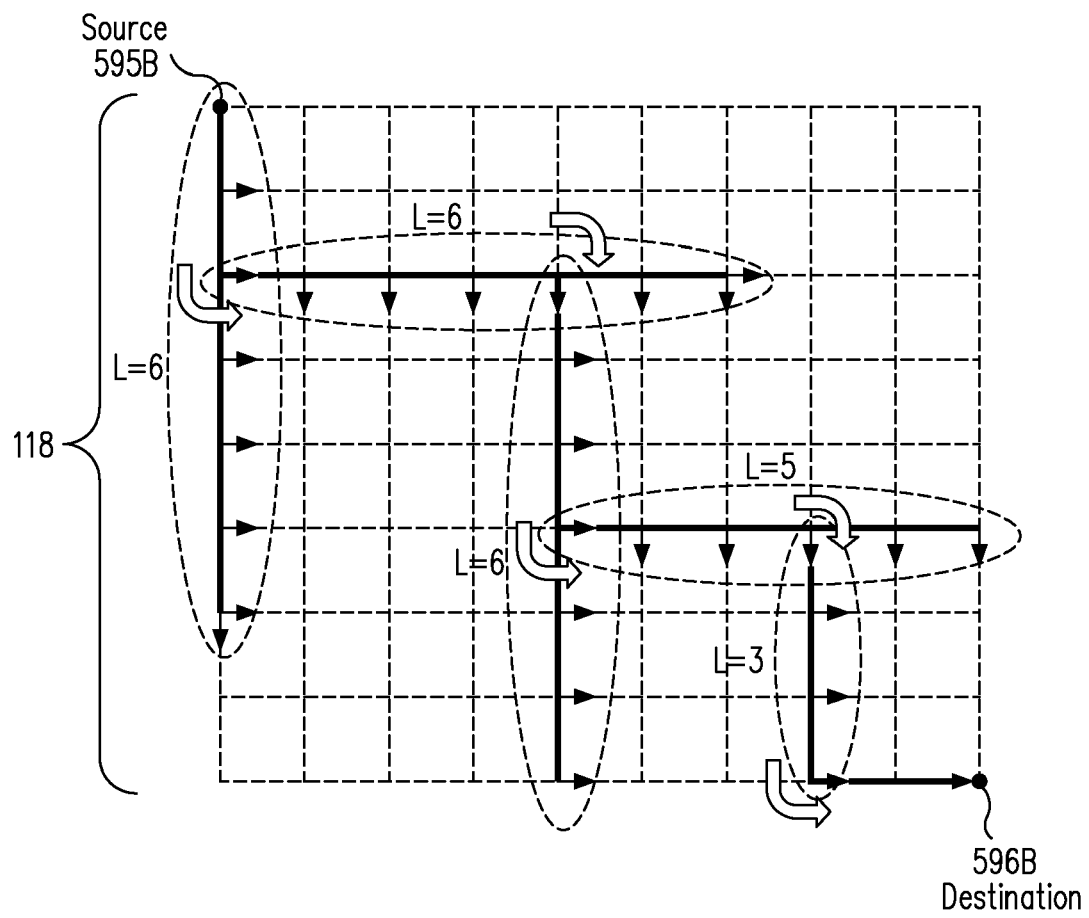

For example, as shown in FIGS. 5D-E, routing resources 118 may be used to provide signal paths from source nodes 595A/B to destination nodes 596A/B. Source nodes 595A/B and destination nodes 596A/B are separated by a horizontal distance of 9 wires and a vertical distance of 8 wires. In the embodiments shown in FIGS. 5D-5E, a maximum trunk length of 6 wires is used. Thus, multiple trunks are appended together to extend the signal paths in horizontal and vertical directions.

The conceptual representations described above with regard to subsets of routing resources 118 can be applied to wires 402 of routing resources 118 as further shown in FIGS. 6A-F. In particular, subsets of routing resources 118 may be identified in accordance with the various rules discussed above and used for determining various types of probability values discussed herein.

Figure 6A:
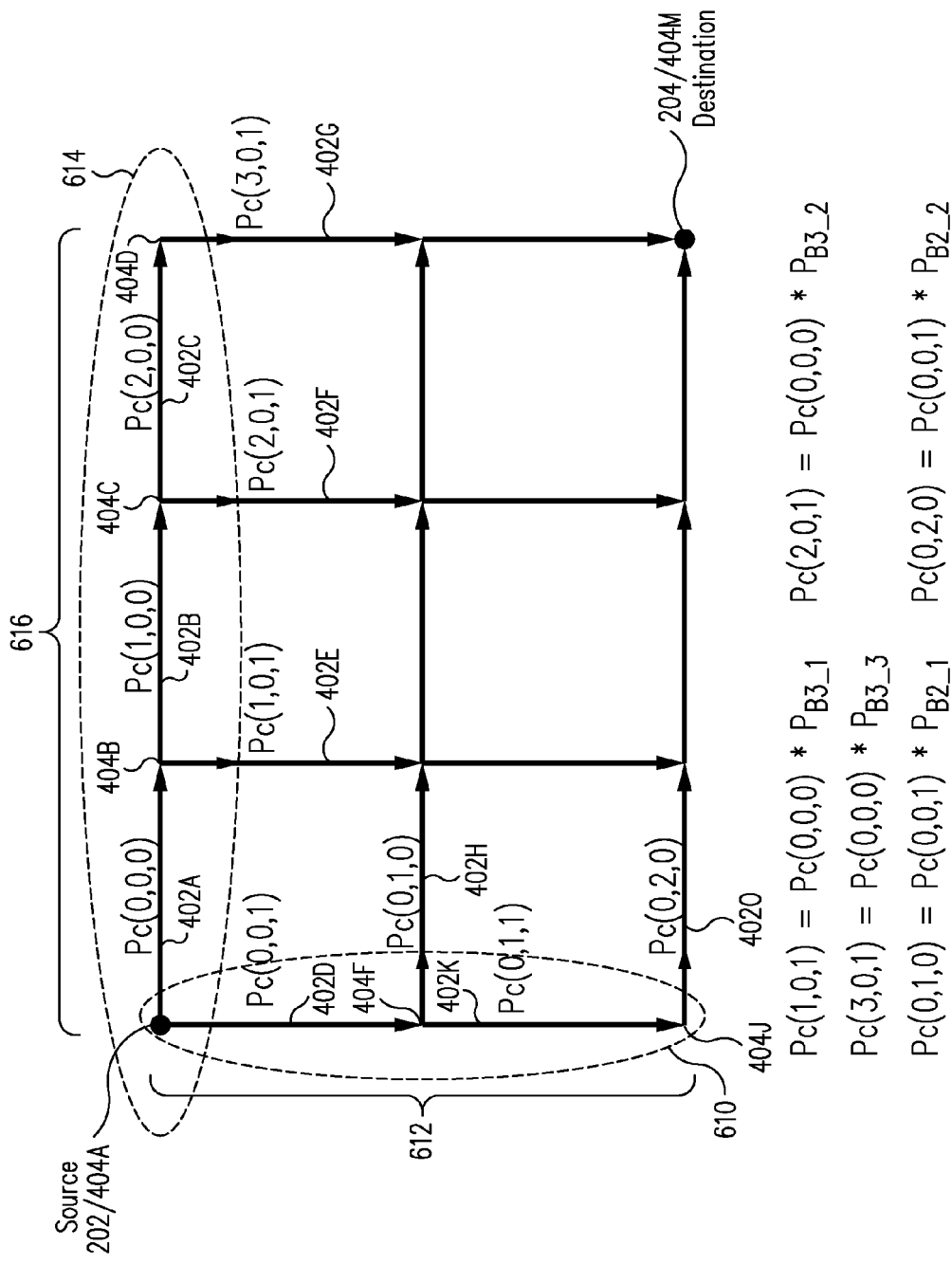
FIGS. 6A-F illustrate routing resources of a PLD used to connect a source node to a destination node in accordance with embodiments of the present invention.

For example, FIG. 6A identifies two subsets 610 and 614 of routing resources 118. In this regard, subset 610 includes a root node 404A (corresponding to source node 202 in this example) connected to a trunk 612 that includes wires 402D and 402K and nodes 404F and 404J. A branch wire 402H is connected to trunk 612 through node 404F, and another branch wire 402O is connected to trunk 612 through node 404J.

It will be appreciated that subset 610 is analogous to subset 500B of FIG. 5B. Thus, as also shown in FIG. 6A, branch wires 402H and 402O will be associated with branch probability values $P_{B2\_1}$ and $P_{B2\_2}$, respectively, which correspond to the probabilities that either branch wire 402H or 402O will be selected to be part of a signal path that passes through node 404F (e.g., one of signal paths G, H, I, or J).

Subset 614 includes root node 404A connected to a trunk 616 that includes wires 402A, 402B, and 402C, and nodes 404B, 404C, and 404D. Branch wires 402E, 402F, and 402G are connected to trunk 616 through nodes 404B, 404C, and 404D, respectively.

It will be appreciated that subset 614 is analogous to subset 500C of FIG. 5C. Thus, branch wires 402E, 402F, and 402G are associated with branch probability values $P_{B3\_1}$, $P_{B3\_2}$, and $P_{B3\_3}$, respectively, which correspond to the probabilities that either branch wire 402E, 402F, or 402G will be selected to be part of a signal path that passes through node 404B (e.g., one of signal paths A, B, C, D, E, or F).

As shown in FIG. 6A, each wire of subsets 610 and 614 has an associated source/destination probability value in the form Pc(i,j,k) which, as previously discussed, corresponds to the probability that the wire will be used by a signal path (e.g., one of signal paths A-J shown in FIG. 3) to connect source node 202 with destination node 204.

In one embodiment, source/destination probability values Pc(0,0,0) and Pc(0,0,1) of wires 402A and 402D may be determined by appropriate benchmark testing of existing PLD configurations in a similar fashion as branch probability values $P_{B2\_1}$, $P_{B2\_2}$, $P_{B3\_1}$, $P_{B3\_2}$, and $P_{B3\_3}$ as discussed above. In another embodiment, source/destination probability values Pc(0,0,0) and Pc(0,0,1) may be assumed to be equal. It will be appreciated that because any signal path passing through root node 404A will pass through either wire 402A or 402D, the sum of source/destination probability values Pc(0,0,0) and Pc(0,0,1) is 1.

As further shown in FIG. 6A, source/destination probability values Pc(i,j,k) of all other wires of subsets 610 and 614 may be expressed in terms of source/destination probability values Pc(0,0,0) and Pc(0,0,1), and branch probability values $P_{B2\_1}$, $P_{B2\_2}$, $P_{B3\_1}$, $P_{B3\_2}$, and $P_{B3\_3}$. Thus, by initially determining source/destination probability values Pc(0,0,0) and Pc(0,0,1), and branch probability values $P_{B2\_1}$, $P_{B2\_2}$, $P_{B3\_1}$, $P_{B3\_2}$, and $P_{B3\_3}$ through benchmark testing, the remaining source/destination probability values shown in FIG. 6A may be determined.

Figure 6B:
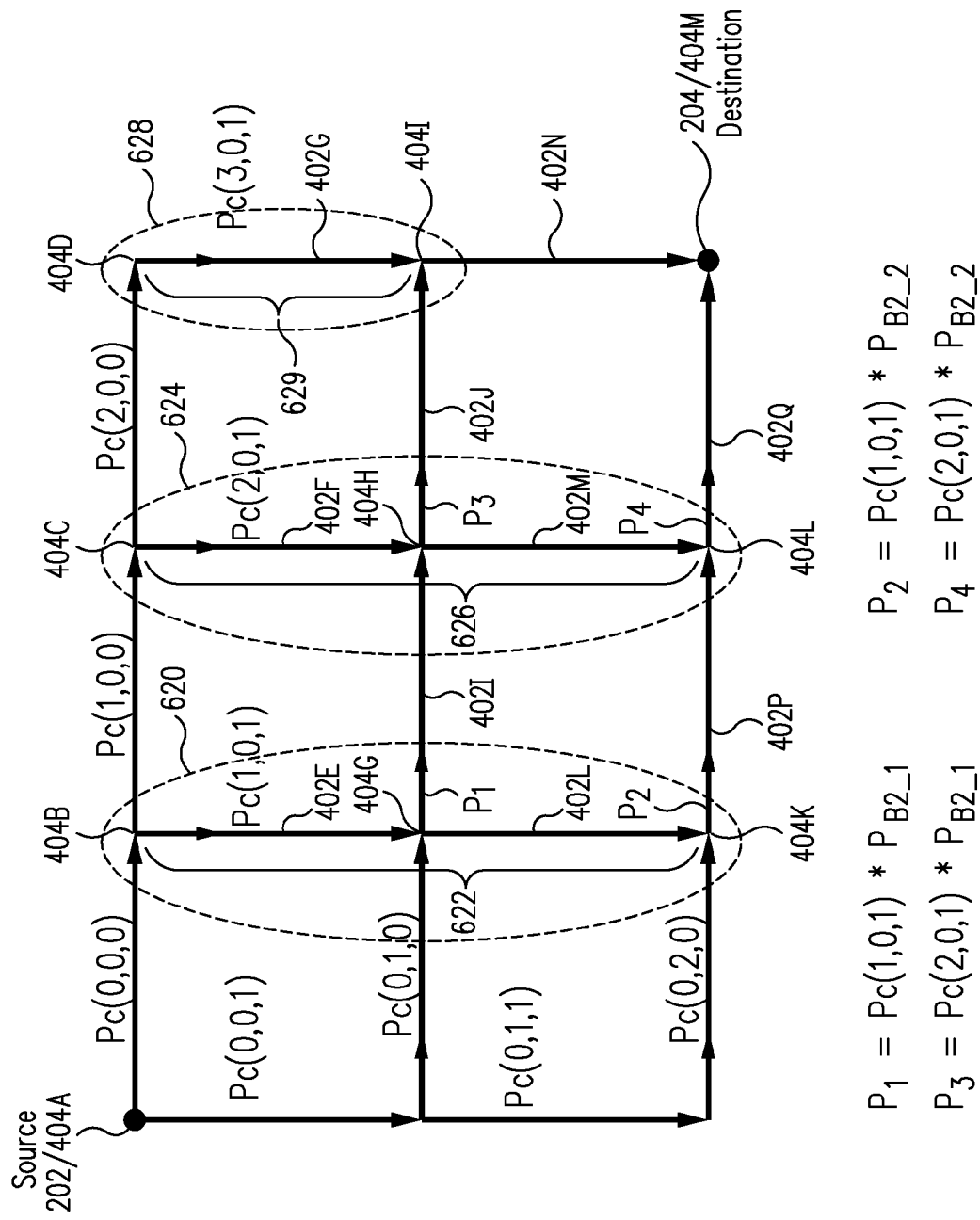

FIG. 6B identifies additional subsets 620, 624, and 628 which use nodes 404B, 404C, and 404D as root nodes.

Subset 620 includes node 404B which is used as the root node for subset 620. Node 404B is connected to a trunk 622 that includes wires 402E and 402L and nodes 404G and 404K. A branch wire 402I is connected to trunk 622 through node 404G, and another branch wire 402P is connected to trunk 622 through node 404K.

Subset 624 includes node 404C which is used as the root node for subset 624. Node 404C is connected to a trunk 626 that includes wires 402F and 402M and nodes 404H and 404L. A branch wire 402J is connected to trunk 626 through node 404H, and another branch wire 402Q is connected to trunk 626 through node 404L.

Subset 628 includes node 404D which is used as the root node for subset 628. Node 404D is connected to a trunk 629 that includes wire 402G and node 404I. As shown by the arrows in FIG. 6B, subset 628 does not include any branch wires. In this regard, a signal propagating down wire 402G to node 404I will continue down to wire 402N and cannot branch to a different path.

Subsets 620 and 624 are analogous to subset 500B of FIG. 5B. Thus, branch wires 402I and 402P are associated with branch probability values $P_{B2\_1}$ and $P_{B2\_2}$, respectively, which correspond to the probabilities that either branch wire 402I or 402P will be selected to be part of a signal path that passes through nodes 404A, 404B, and 404G (e.g., one of signal paths D, E, or F). Also, branch wires 402J and 402Q are associated with branch probability values $P_{B2\_1}$ and $P_{B2\_2}$, respectively, which correspond to the probabilities that either branch wire 402J or 402Q will be selected to be part of a signal path that passes through nodes 404A, 404B, 404C, and 404H (e.g., one of signal paths B or C).

Branch wire 402I has an associated intermediate probability value P1 which identifies the probability that wire 402I will be used by a signal path that includes intermediate wire 402E connected between wire 402I and source node 202 (e.g., signal path D, E, or F). Similarly, branch wire 402P has an associated intermediate probability value P2 which identifies the probability that wire 402P will be used by a signal path that includes intermediate wire 402E connected between wire 402I and source node 202.

Branch wire 402J has an associated intermediate probability value P3 which identifies the probability that wire 402J will be used by a signal path that includes intermediate wire 402F connected between wire 402J and source node 202 (e.g., signal path B or C). Similarly, branch wire 402Q has an associated intermediate probability value P4 which identifies the probability that wire 402Q will be used by a signal path that includes intermediate wire 402F connected between wire 402Q and source node 202.

As further shown in FIG. 6B, the intermediate probability values P1, P2, P3, and P4, may be expressed in terms of other probabilities previously identified in FIG. 6A.

It will be appreciated that probability values in the form Pc(i,j,k) are not shown in FIG. 6B for wires 402I, 402P, 402J, and 402Q. This is because additional intermediate probability values have not yet been calculated for other signal paths in which wires 402I, 402P, 402J, and 402Q may be used. For example, wire 402I may be used by any of signal paths D, F, G, or I; wire 402P may be used by any of signal paths E, H, or J; wire 402J may be used by any of signal paths B, D, or G; and wire 402Q may be used by any of signal paths C, E, F, H, I, or J. The relevant intermediate probability values for these and other wires may be determined as further shown in FIGS. 6C-F.

FIGS. 6C-F identify how the relevant remaining partial probability values and source/destination probability values may be calculated for all of wires 402 by identifying additional subsets 630, 632, 634, 636, and 638.

Figure 6C:
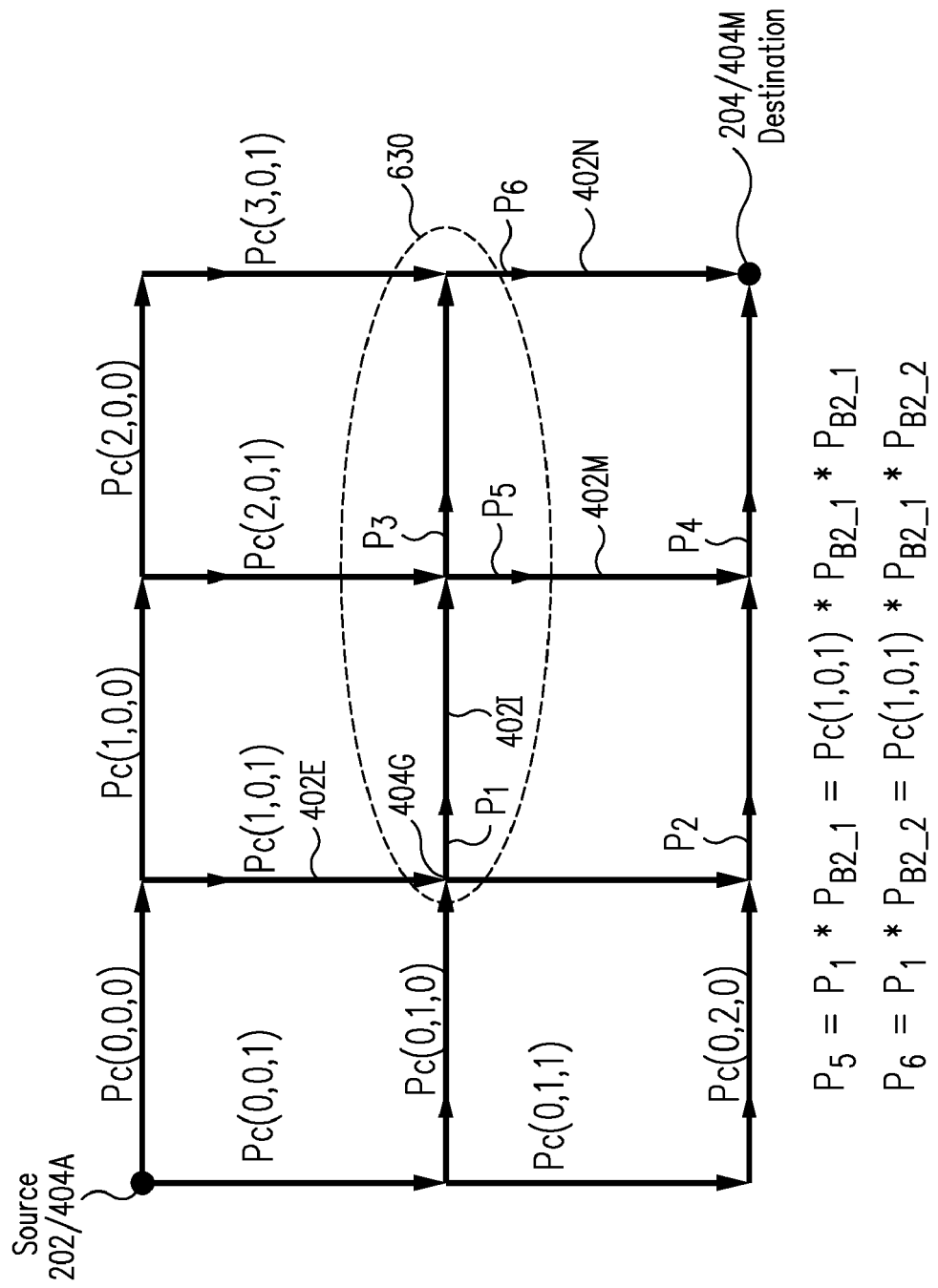

For example, FIG. 6C identifies a subset 630 which may be used to provide a portion of signal paths D and F. Subset 630 is two wires long and is therefore analogous to subset 500B of FIG. 5B. Node 404G of subset 620 (shown in FIG. 6B) is used as the root node for subset 630.

Branch wire 402M (e.g., branching from subset 630 which in turn branches from subset 622) has an associated intermediate probability value P5 which identifies the probability that wire 402M will be used by a signal path that also includes intermediate wires 402E and 402I of subsets 622 and 630, respectively, connected between branch wire 402M and source node 202. Branch wire 402N (e.g., branching from subset 630 which in turn branches from subset 622) has an associated intermediate probability value P6 which identifies the probability that wire 402N will be used by a signal path that also includes intermediate wires 402E and 402I of subsets 622 and 630, respectively, connected between branch wire 402N and source node 202.

Figure 6D:
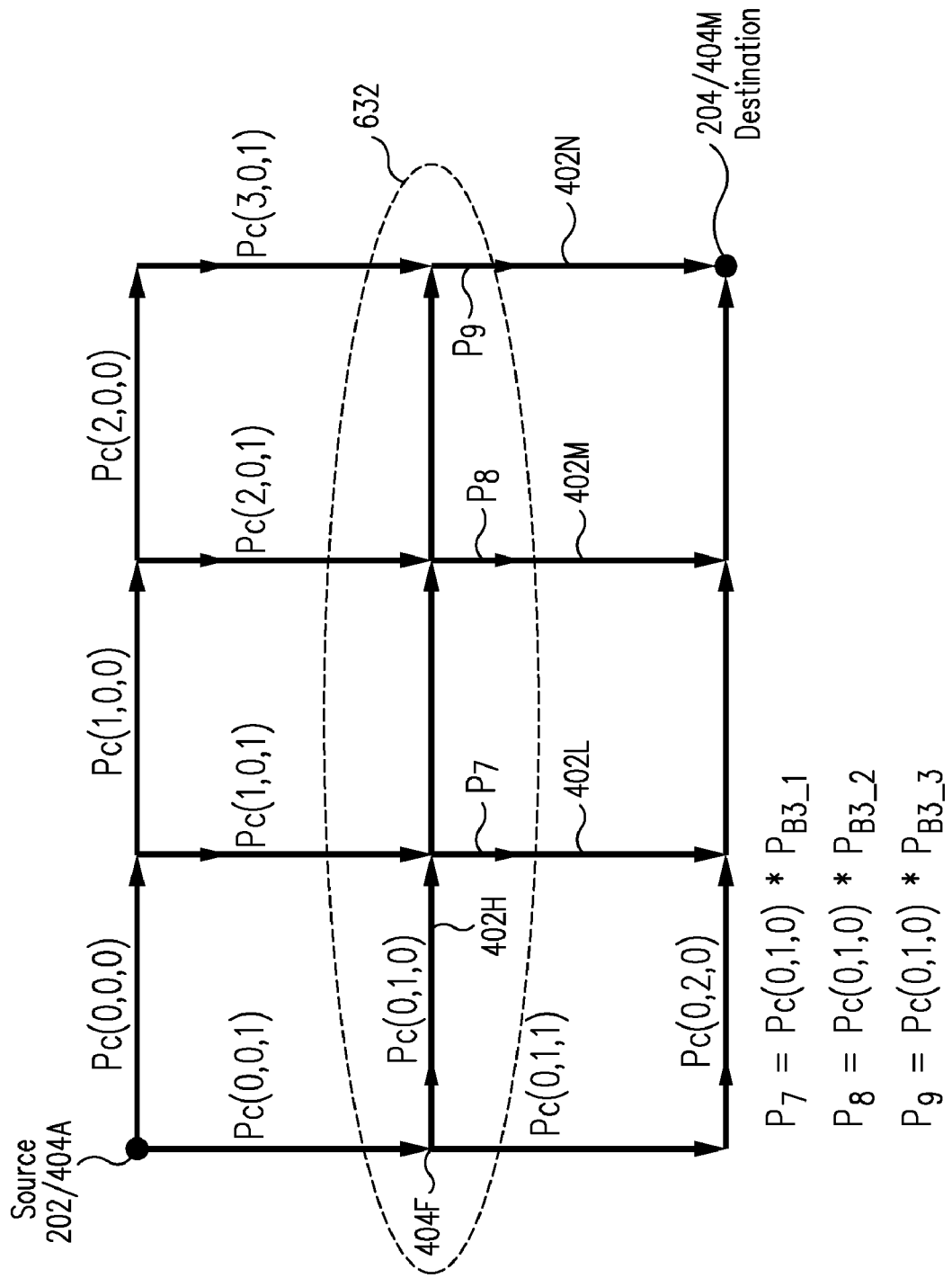

FIG. 6D identifies a subset 632 which may be used to provide a portion of signal path G. Subset 632 is three wires long and is therefore analogous to subset 500C of FIG. 5C. Node 404F of subset 612 (shown in FIG. 6A) is used as the root node for subset 632. Branch wires 402L, 402M, and 402N have associated intermediate probability values P7, P8, and P9, respectively, which identify the probabilities that such wires will be used by a signal path that includes intermediate wire 402H of subset 632 connected between such wires and source node 202.

Figure 6E:
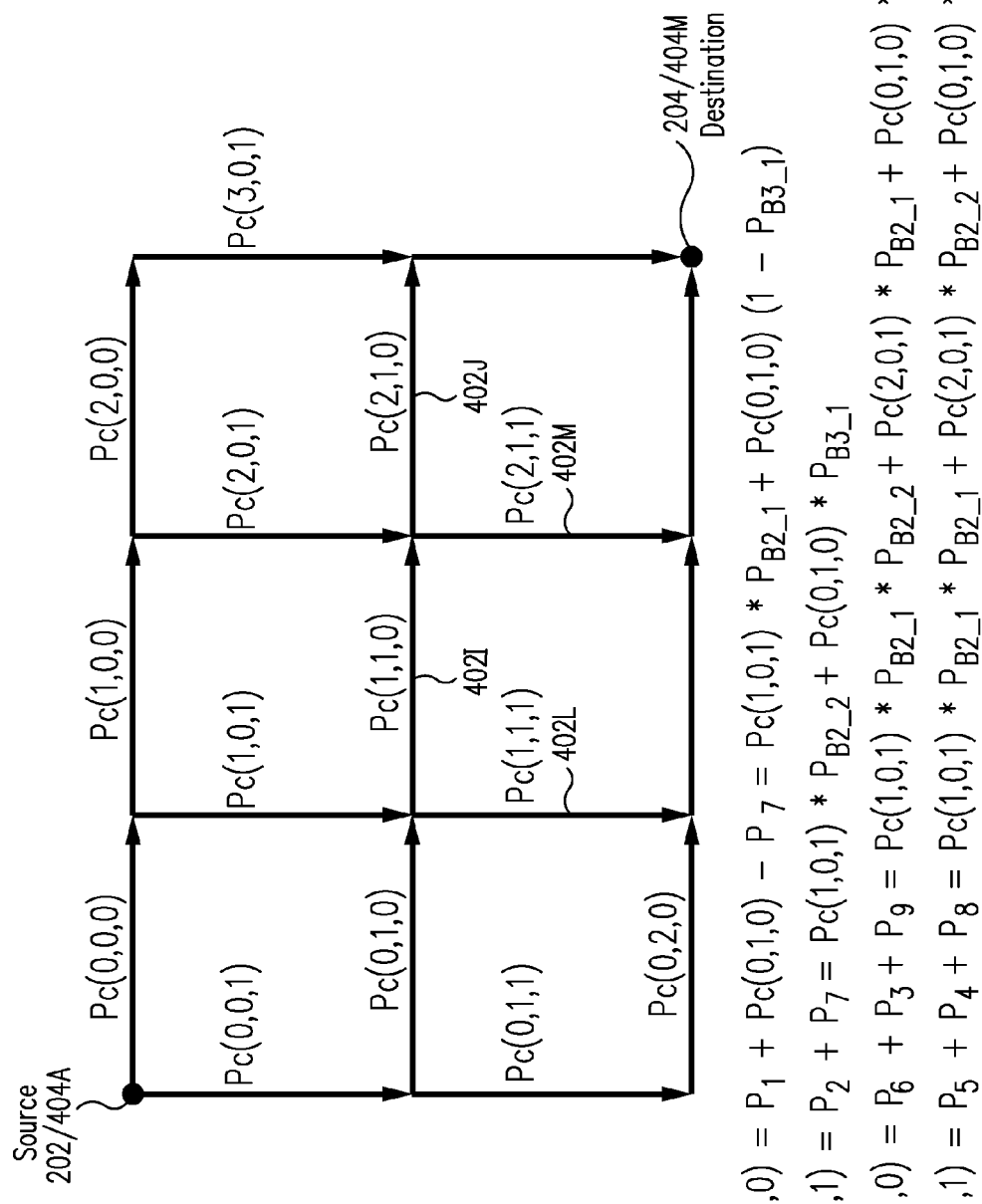

FIG. 6E identifies that source/destination probability values of the form Pc(i,j,k) for wires 402I, 402J, 402L, and 402M may be expressed in terms of other probability values determined in FIGS. 6A-D.

Figure 6F:
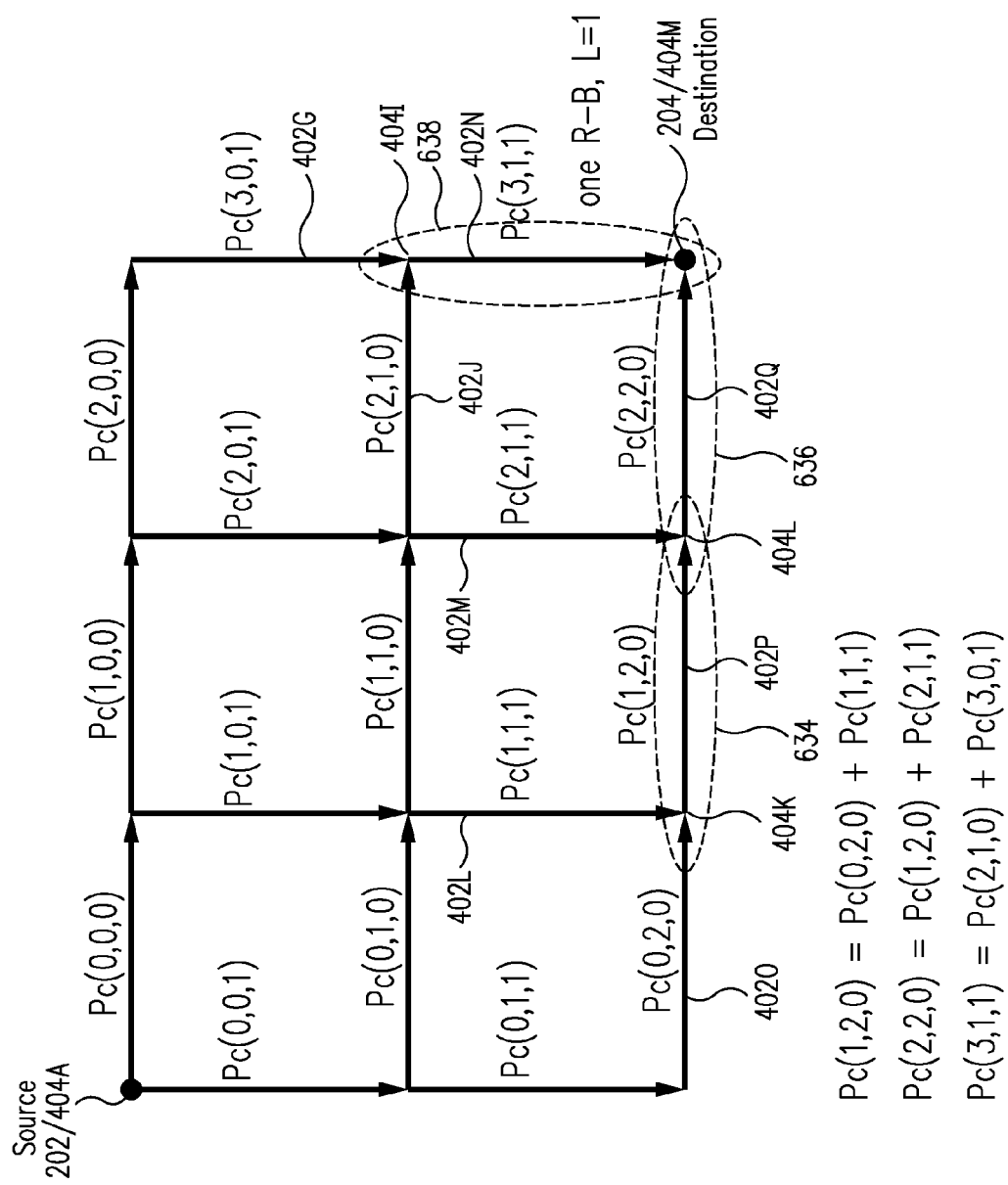

FIG. 6F identifies subsets 634, 636, and 638. Subsets 634, 636, and 638 are each one wire long and therefore are analogous to subset 500A of FIG. 5A. As shown in FIG. 6F, nodes 404K, 404L, and 404I are used as root nodes for subsets 634, 636, and 638, respectively.

As indicated by the directions of wires 402L and 402O, all signal paths passing through wire 402P of subset 634 pass through either wire 402L or 402O. Accordingly, the source/destination probability value Pc(1,2,0) associated with wire 402P is the sum of the source/destination probability values Pc(0,2,0) and Pc(1,1,1) of wires 402O and 402L, respectively. Source/destination probability values for wires 402Q and 402N of subsets 636 and 638, respectively, can be similarly determined as shown in FIG. 6F.

Accordingly, as shown in FIG. 6F, source/destination probability values of the form Pc(i,j,k) can be calculated for all wires 402A-Q of portion 200 of routing resources 118 using the root-trunk-branch conceptual representations explained above.

As shown in the various equations illustrated in FIGS. 6A-F, source/destination probability values for all of wires 402A-Q may be determined if initial values are known for Pc(0,0,0), Pc(0,0,1), $P_{B2\_1}$, $P_{B2\_2}$, $P_{B3\_1}$, $P_{B3\_2}$ and $P_{B3\_3}$. As previously discussed, such values may be determined, for example, by appropriate benchmark testing of PLD configurations.

Accordingly, the following Table 1 provides examples of probability values for wires 402A-Q, assuming that the following preliminary values have been determined by appropriate benchmark testing: Pc(0,0,0)=Pc(0,0,1)=0.5, $P_{B2\_1}$=0, $P_{B2\_2}$=1, $P_{B3\_1}$=0, $P_{B3\_2}$=0.4, and $P_{B3\_3}$=0.6.

TABLE 1

| WIRE | PROBABILITY Pc(i, j, k) | PROBABILITY VALUE |
|---|---|---|
| 402A | Pc(0, 0, 0) | 0.5 |
| 402B | Pc(1, 0, 0) | 0.5 |
| 402C | Pc(2, 0, 0) | 0.3 |
| 402D | Pc(0, 0, 1) | 0.5 |
| 402E | Pc(1, 0, 1) | 0.0 |
| 402F | Pc(2, 0, 1) | 0.2 |
| 402G | Pc(3, 0, 1) | 0.3 |
| 402H | Pc(0, 1, 0) | 0.0 |
| 402I | Pc(1, 1, 0) | 0.0 |
| 402J | Pc(2, 1, 0) | 0.0 |
| 402K | Pc(0, 1, 1) | 0.5 |
| 402L | Pc(1, 1, 1) | 0.0 |
| 402M | Pc(2, 1, 1) | 0.2 |
| 402N | Pc(3, 1, 1) | 0.3 |
| 402O | Pc(0, 2, 0) | 0.5 |
| 402P | Pc(1, 2, 0) | 0.5 |
| 402Q | Pc(2, 2, 0) | 0.7 |

Based on the probabilities shown in Table 1, it will be appreciated that wire 402Q has the highest source/destination probability value of all of wires 402A-Q and is therefore likely to be more frequently used than the other wires by signal paths A-J to connect source node 202 with destination node 204. It will also be appreciated that wires 402E, 402H, 402I, 402J, 402L each have source/destination probability values of 0.0 and are therefore unlikely to be used by any of signal paths A-J in this example.

Figure 7:
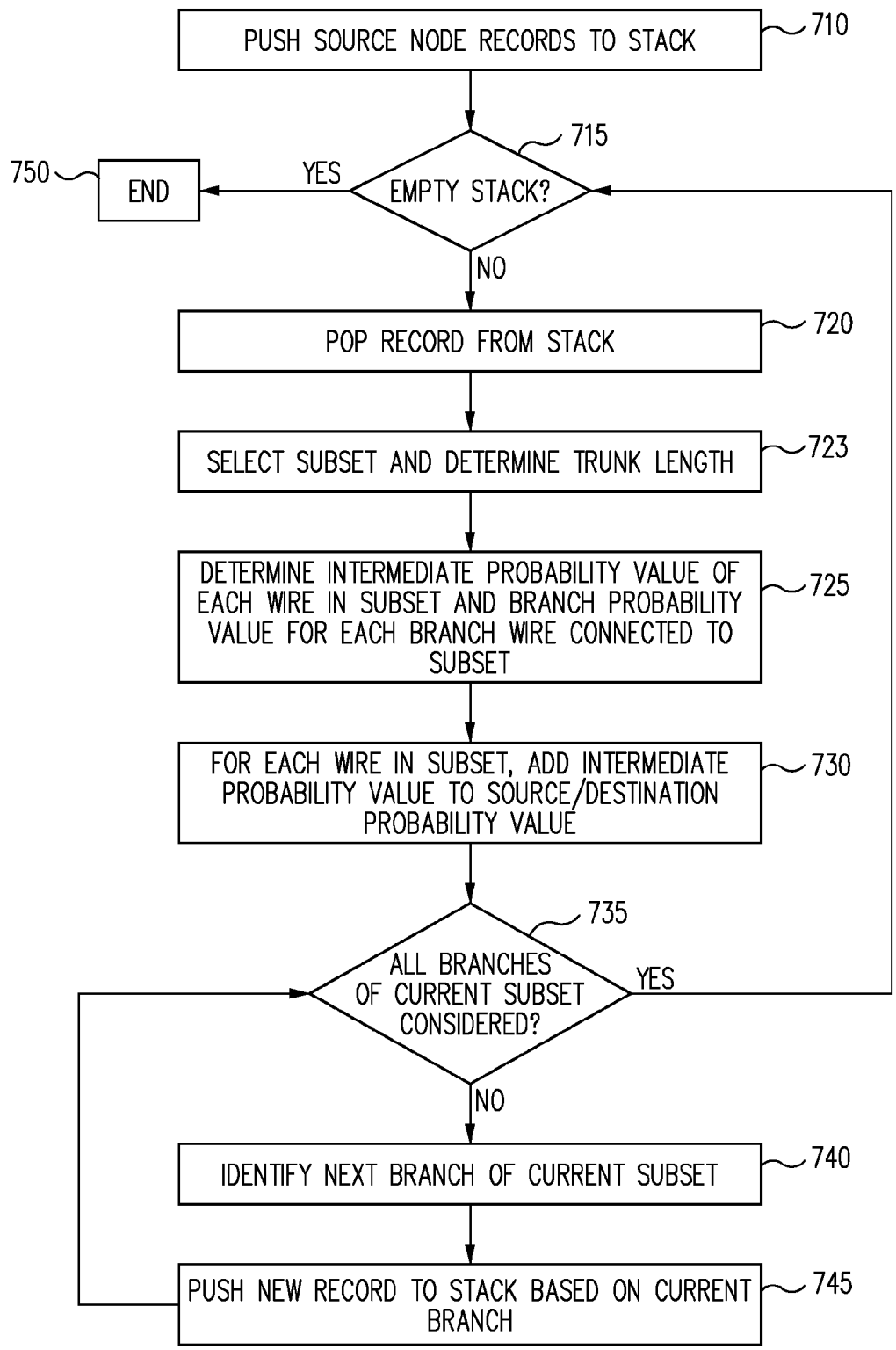
FIG. 7 illustrates a process to determine probability values for wires used to connect source and destination nodes of a PLD in accordance with an embodiment of the present invention.

FIG. 7 illustrates a process that applies the principles described above to determine source/destination probability values for wires used to connect source and destination nodes of PLD 100. In the process of FIG. 7, stack 130 maintained by memory 126 of system 120 may be used to identify various subsets of routing resources (e.g., combinations of root nodes, trunks, and branch wires). In this regard, appropriate records (e.g., data structures or other appropriate types of records) may be added to stack 130. As records are popped from stack 130, subsets may be identified and probability values associated with the subsets may be calculated.

The process of FIG. 7 will be described in relation to source node 202 and destination node 204 and FIGS. 6A-F discussed above. However, the process of FIG. 7 may be performed for any desired combination of source and destination nodes of PLD 100.

Turning now to the particular steps of FIG. 7, in step 710, information (e.g., records) which may be used to identify subsets 612 and 614 connected to source node 202 are pushed onto stack 130. In one embodiment, such records may include an identification of root node 202, the direction of each of subsets 612 and 614 (e.g., horizontal or vertical), and the initial probability values Pc(0,0,1) and Pc(0,0,0) associated with subsets 612 and 614.

If one or more records remain on stack 130 (step 715), then the process continues to step 720. In step 720, the most recently pushed record (e.g., a record which may be used to identify subset 614) is popped from stack 130 and considered for processing. In step 723, subset 614 is selected using the record popped in previous step 720 in accordance with one or more of the various techniques described herein. For example, in one embodiment, subset 614 may be selected based on a trunk length also determined in step 723 in accordance with the first, second, or third rules described above.

In step 725, the intermediate probability value for each wire in subset 614 is determined, and the branch probability value for each branch wire connected to subset 614 is also determined. In this case, the intermediate probability value for each wire of subset 614 will be equal to the source/destination probability value for each wire of subset 614 because subset 614 is connected to root node 202 (e.g., no intermediate wires exist between subset 614 and root node 202). Thus, in this iteration of step 725, source/destination probability values Pc(0,0,0), Pc(1,0,0), and Pc(2,0,0) and branch probability values $P_{B3\_1}$, $P_{B3\_2}$ and $P_{B3\_3}$ are determined as previously described with regard to FIG. 6A.

In step 730, for each wire in subset 614, the intermediate probability value (determined in step 725) is added to the source/destination probability value for each wire. As previously described, for the case of subset 614, the intermediate probability value for each wire of subset 614 will be equal to the source/destination probability value for each wire of subset 614. However, if other intermediate probability values had been determined during previous iterations of step 725 (e.g., for other subsets having intermediate wires connected between the subsets and source node 202), then the new intermediate probability values would be added to the previous intermediate probability values to obtain the source/destination probability value for each wire.

In steps 735-745, information used to identify additional subsets connected to the current subset are identified and added to stack 130. For example, as shown in FIG. 6A, branch wires 402E, 402F, and 402G are connected to nodes 404B, 404C, and 404D, respectively, of subset 614. As shown in FIG. 6B, subsets 620, 624, and 629 are associated with branch wires 402E, 402F, and 402G, respectively. Accordingly, during successive iterations of steps 735-745, additional records which may be used to identify subsets 620, 624, and 629 will be added to stack 130. After all of branch wires 402E, 402F, and 402G have been considered (step 735), then the process returns to step 715.

It will be appreciated that at the time the process returns to step 715, records will remain on stack 130 which may be used to identify subsets 612, 622, 626, and 629. Accordingly, during the next iteration of step 720, the record which may be used to identify subset 629 will be popped from stack 130 and processed accordingly.

It will be appreciated that by iteratively performing the various steps of FIG. 7, all subsets of routing resources of portion 200 may be considered in accordance with the root-trunk-branch representations described herein. As a result, a source/destination probability value may be obtained for each of wires 402. This source/destination probability value for each wire corresponds to the probability that the wire will be used by one of signal paths A-J to connect source node 202 with destination node 204. After all subsets have been considered, stack 130 will be empty and the process ends (step 750).

The process of FIG. 7 may be repeated for all possible combinations of source nodes and destination nodes of routing resources 118. Thus, for a different source node 202A and a different destination node 204A (shown in FIG. 2), a different set of source/destination probability values may be obtained for wires in portion 200A of routing resources 118.

Figure 8A:
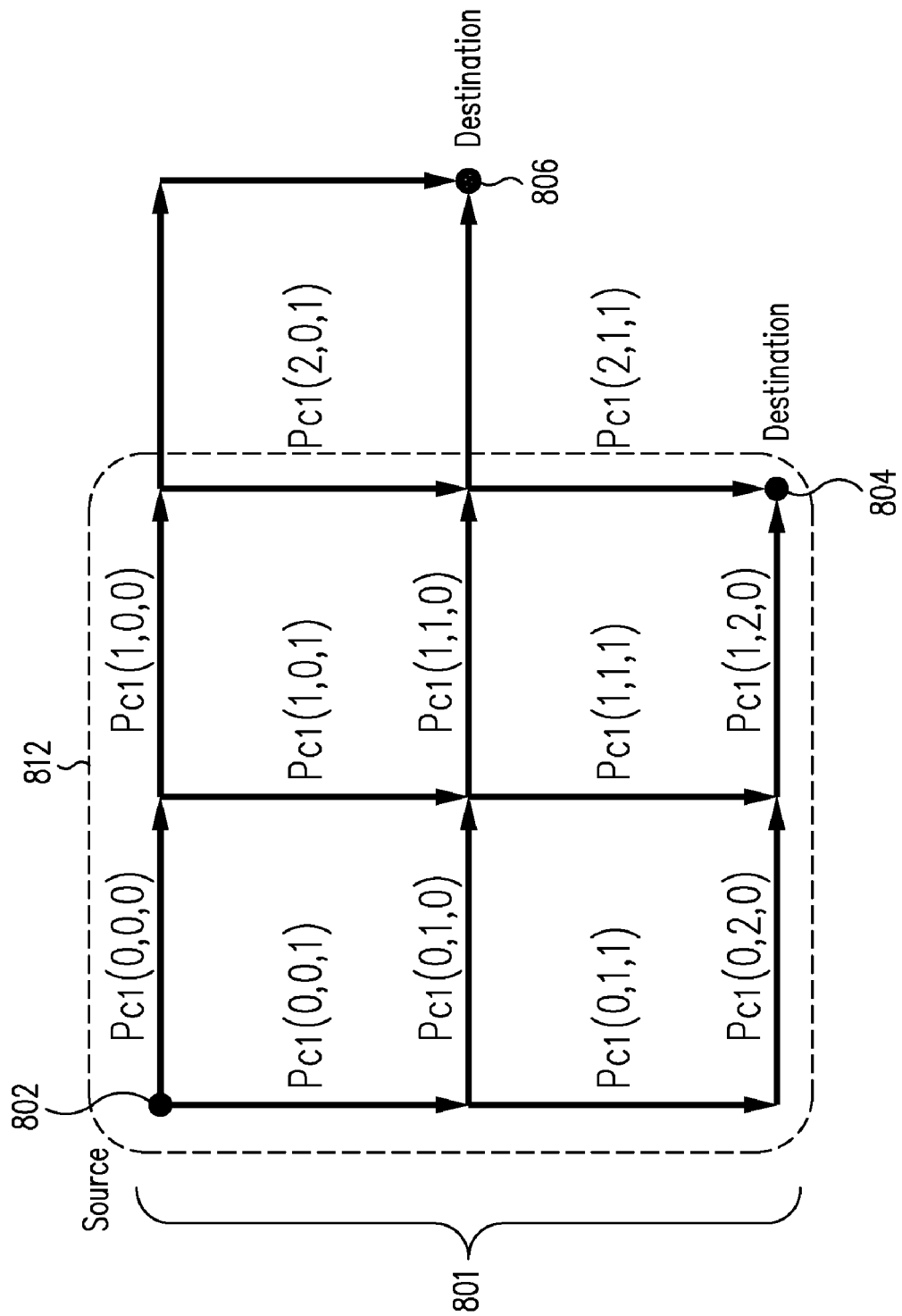
FIGS. 8A-C illustrate routing resources of a PLD used to connect a source node to a plurality of destination nodes in accordance with embodiments of the present invention.
Figure 8B:
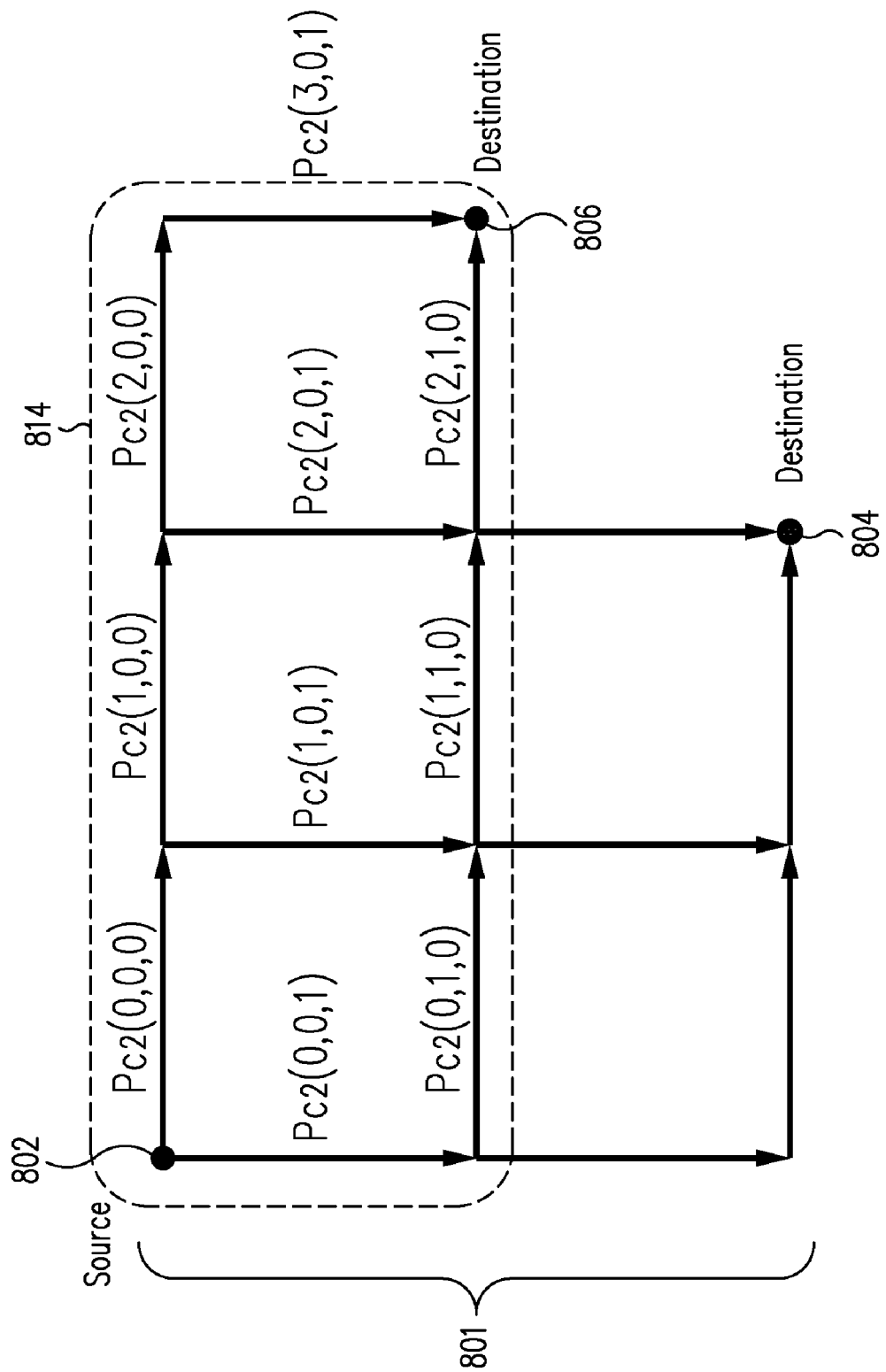
Figure 8C:
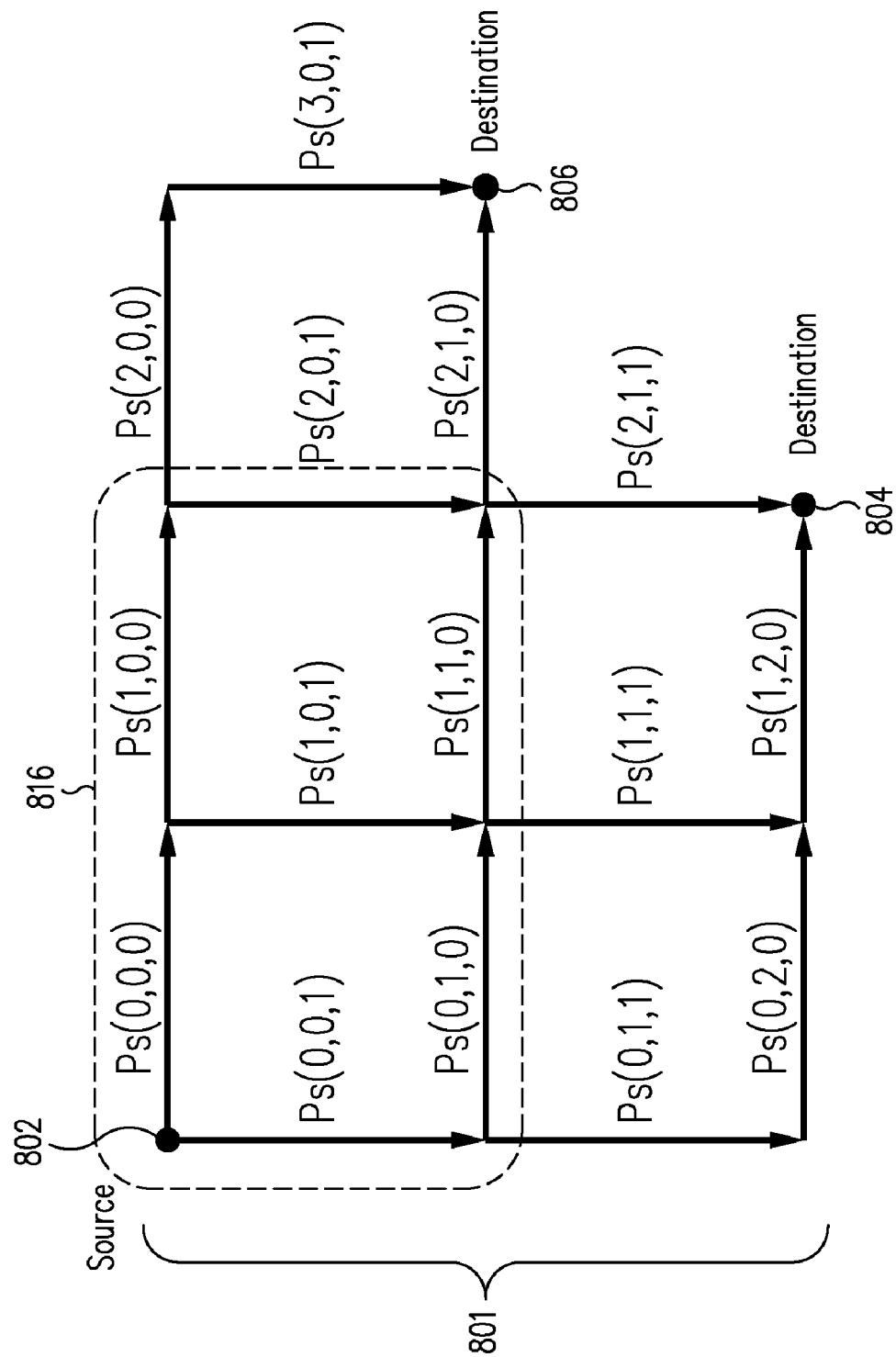

FIGS. 8A-C illustrate embodiments in which wires 801 may be used to connect a source node 802 to two destination nodes 804. In this regard, FIG. 8A identifies a set 812 of wires 801 that may be selectively interconnected to connect source node 802 to destination node 804. A source/destination probability value Pc1(i,j,k) may be determined for each wire 801 of set 812 using the techniques previously discussed herein.

FIG. 8B identifies a set 814 of wires 801 that may be selectively interconnected to connect source node 802 to destination node 806. A source/destination probability value Pc2(i,j,k) may be determined for each wire 801 of set 814 using the techniques previously discussed herein.

FIG. 8C identifies a set 816 of wires 801 that are present in both of sets 812 and 814. In this regard, because source node 802 may be connected to both of destination nodes 804 and 806, it is possible that wires 801 of set 816 may be used to carry a signal to both of destination nodes 804 and 806.

Accordingly, in one embodiment, the source/destination probability value assigned to each wire 801 of set 816 may be the maximum source/destination probability value applicable to the wire 801 from set 812 or 814. Accordingly, the source/destination probability values associated with wires 801 in FIG. 8C have been renamed Ps(i,j,k) in FIG. 8C. Source/destination probability values Ps(i,j,k) which may be determined in accordance with the following equation 1, where n identifies the different combinations of source and destination nodes (e.g., n=1 identifies the combination of source node 802 and destination node 804; n=2 identifies the combination of source node 802 and destination node 806):

$$P_s(i,j,k)=\text{MAX}(P_{cn}[(i_n+\Delta i),(j_n+\Delta j),k]) \qquad \text{(equation 1)}$$

Figure 9A:
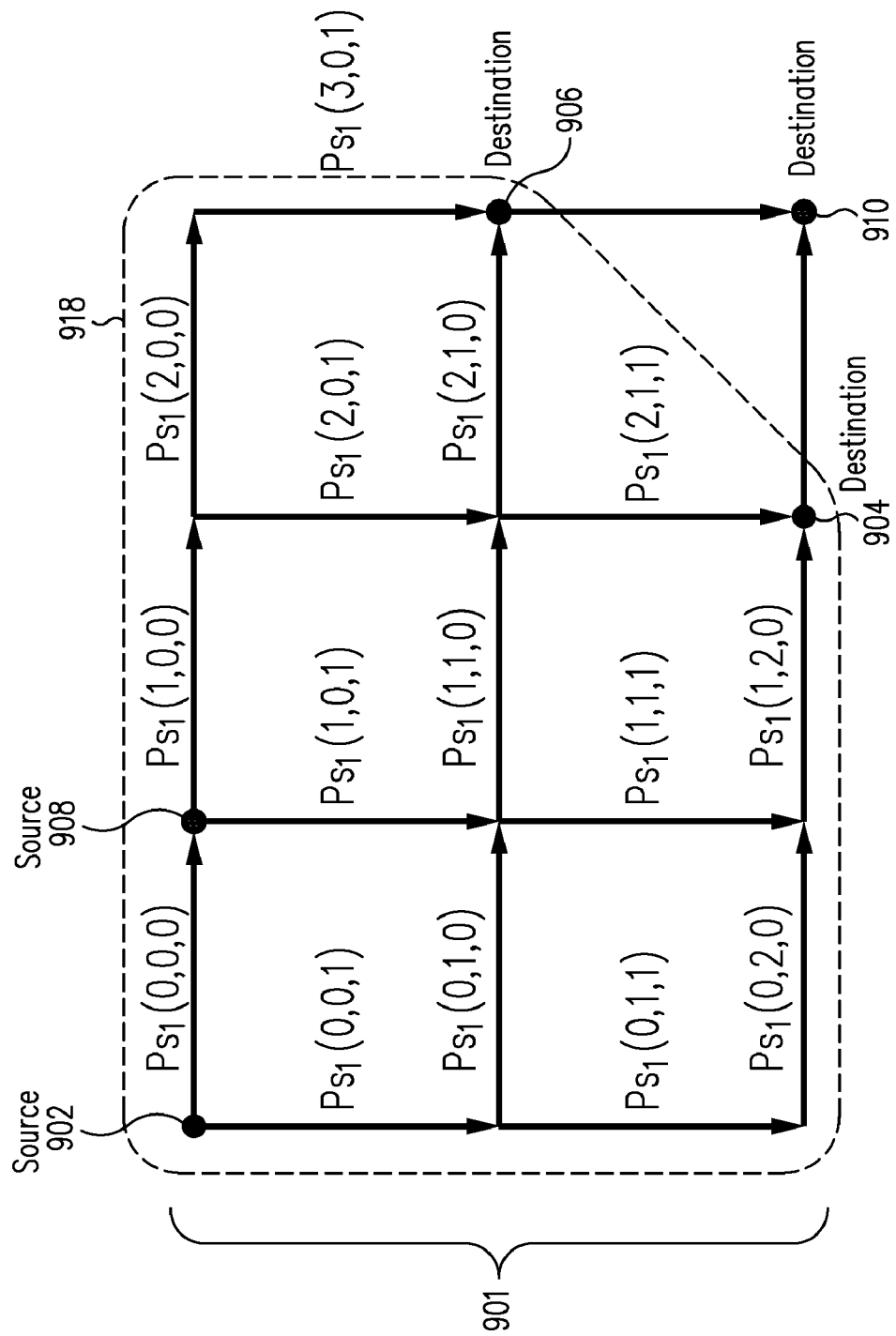
FIGS. 9A-C illustrate routing resources of a PLD used to connect a plurality of source nodes to a plurality of destination nodes in accordance with an embodiment of the present invention.
Figure 9B:
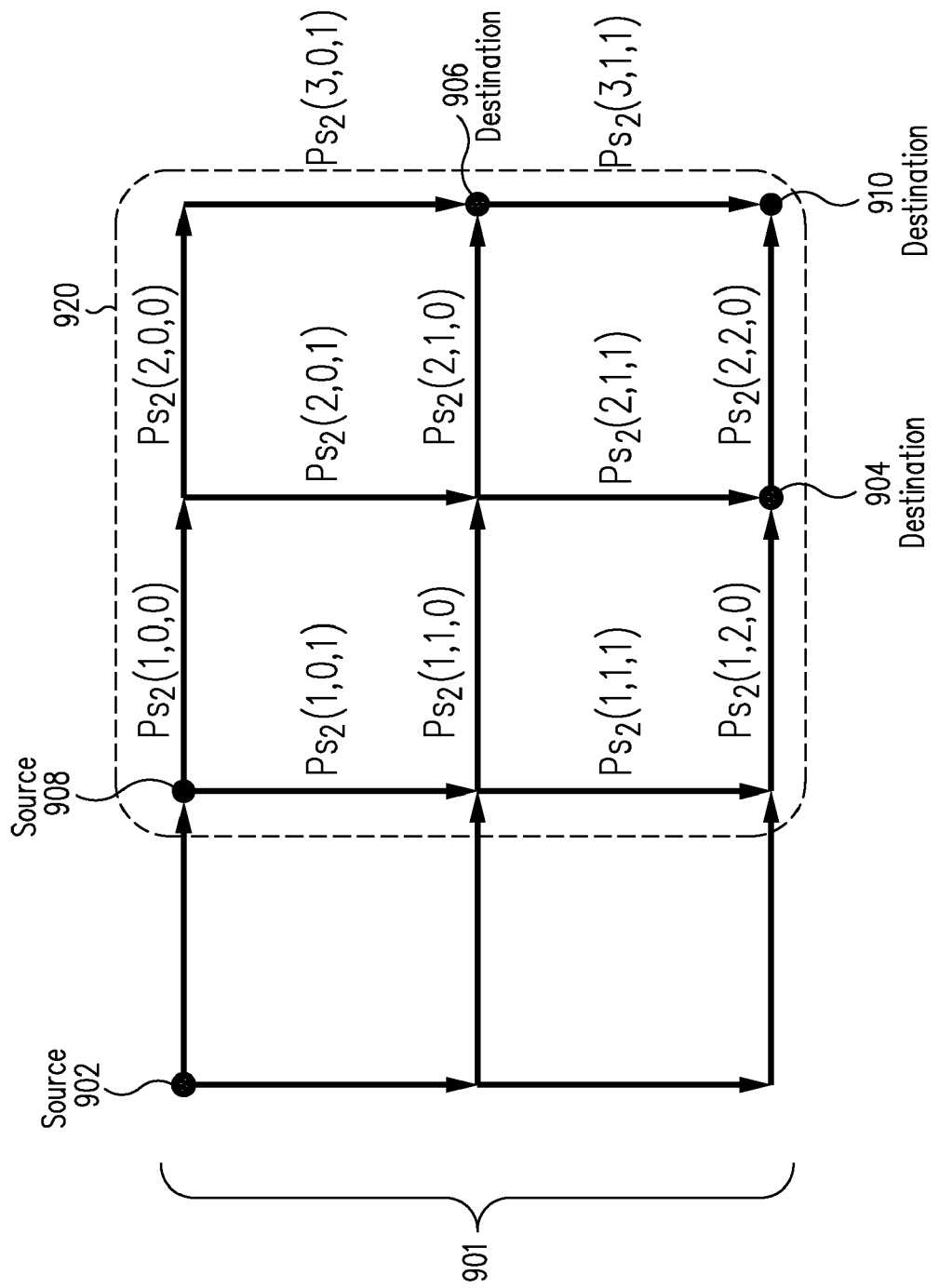
Figure 9C:
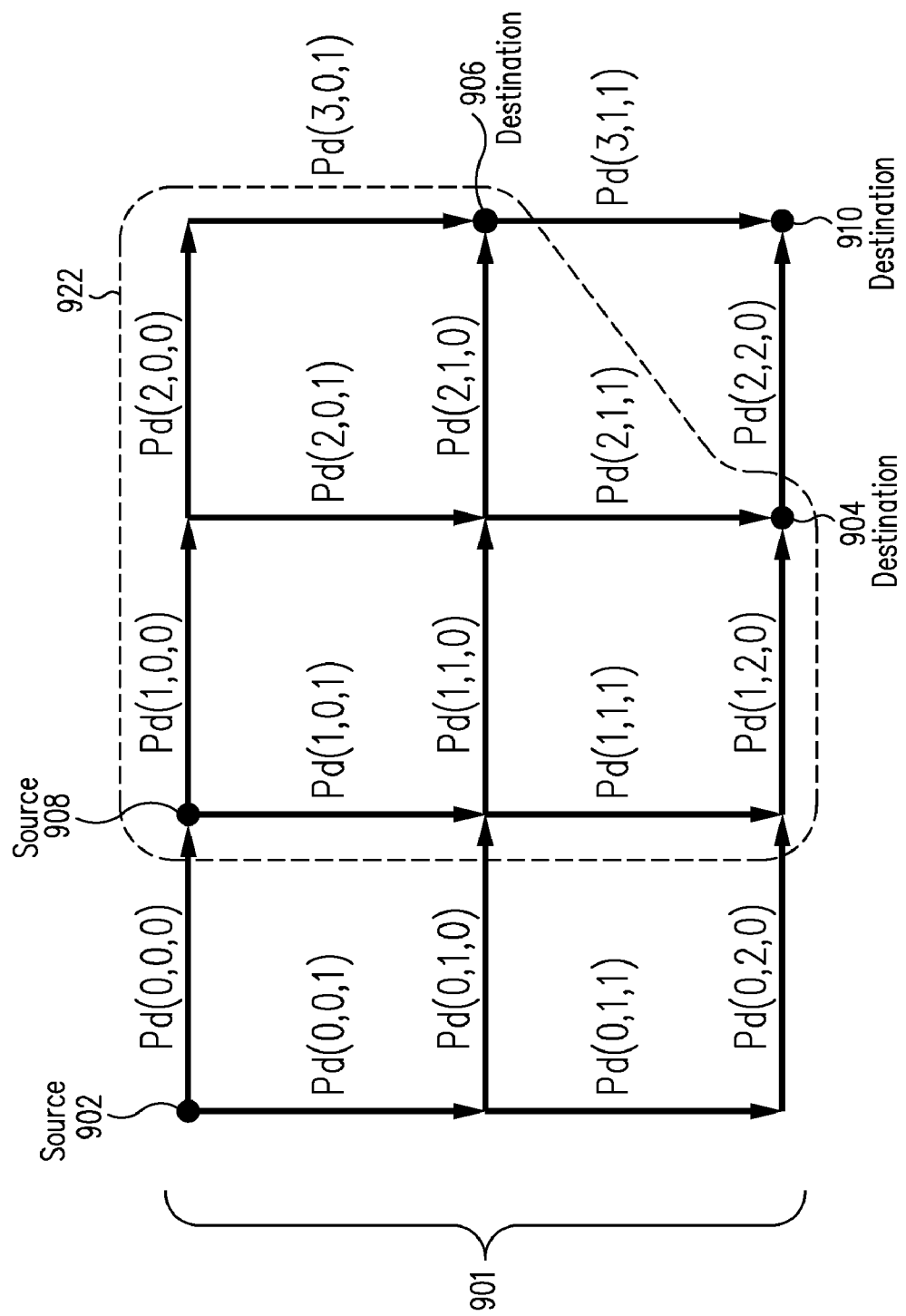

FIGS. 9A-C illustrate embodiments in which a source node 902 may be connected to two destination nodes 904 and 906 to provide a first signal path from source node 902 to both of destination nodes 904 and 906 through wires 901 similar to the example described in FIGS. 8A-C. Also in FIGS. 9A-C, another source node 908 may be connected to a destination node 910 to provide a second signal path from source node 908 to destination node 910 through wires 901.

FIG. 9A identifies a set 918 of wires 901 that may be selectively interconnected to connect a source node 902 to destination nodes 904 and 906. It will be appreciated that the source/destination probability values associated with set 918 in FIG. 9A may be determined in accordance with the techniques described herein as applied to FIGS. 8A-C. In the example shown in FIG. 9A, the source/destination probability values of set 918 are identified as Ps1(i,j,k) to indicate that these probability values refer to the connection of source node 902 to destination nodes 904 and 906.

FIG. 9B identifies a set 920 of wires 901 that may be selectively interconnected to connect source node 908 to destination node 910. It will be appreciated that the source/destination probability values associated with set 920 in FIG. 9B may be determined in accordance with the techniques previously described herein. In the example shown in FIG. 9B, the source/destination probability values of set 920 are identified as Ps2($i,j,k$) to indicate that these probability values refer to the connection of source node 908 to destination node 910.

FIG. 9C identifies a set 922 of wires 901 corresponding to wires 901 present in both of sets 918 and 920.

In order to estimate the congestion density of each of wires 901, the probabilities associated with all signal paths of a PLD configuration for each wire may be added together to provide a wire congestion value Pd(i,j,k) for each wire 901.

In this regard, the probability values associated with all signal paths for all source and destination nodes of PLD 100 may be added together in accordance with the following equation 2 which sums the values determined by equation 1 previously discussed:

$$P_d(i,j,k) = \Sigma(P_s[(i_n + \Delta i), (j_n + \Delta j), k]) \quad \text{(equation 2)}$$

Figure 10:
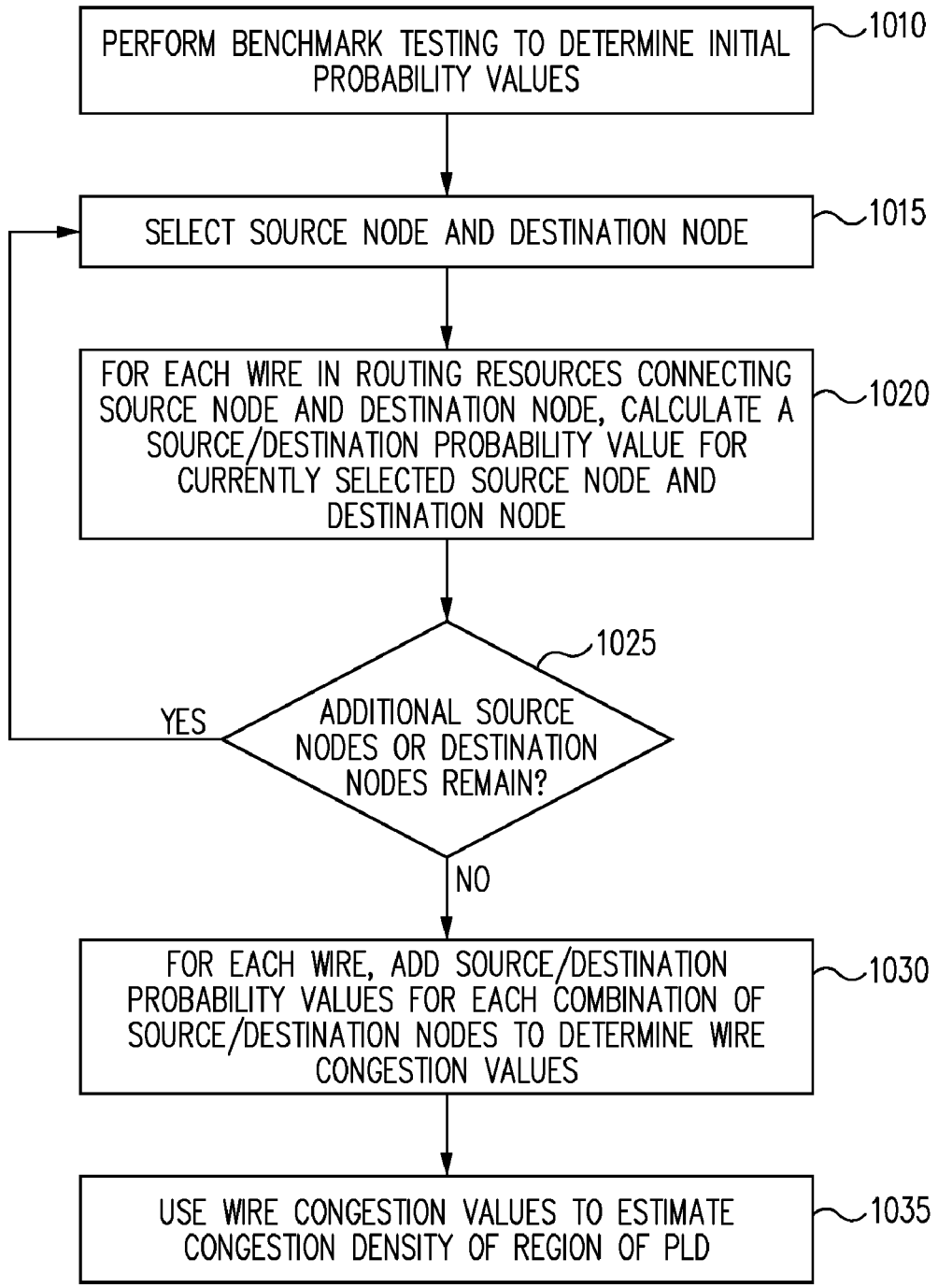
FIG. 10 illustrates a process of estimating signal congestion of a PLD in accordance with an embodiment of the present invention.

FIG. 10 illustrates a process of estimating signal congestion in PLD 100 in accordance with an embodiment of the invention. The process of FIG. 10 will be described in relation to source nodes 202/202A and destination nodes 204/204A of FIG. 2. However, the process of FIG. 10 may be performed for any desired combination of source and destination nodes of PLD 100.

In initial step 1010, benchmark testing is performed to determine initial values for branch probability values $P_{B2\_1}$, $P_{B2\_2}$, $P_{B3\_1}$, $P_{B3\_2}$, and $P_{B3\_3}$, as well as source/destination probability values associated with wires directly connected to source nodes 202/202A.

In step 1015, a first combination of source and destination nodes is selected. For example, in one embodiment, source node 202 and destination node 204 may be selected.

In step 1020, the process of FIG. 7 may be performed to determine source/destination probability values for each wire in the portion of routing resources 118 which may be used to connect the selected source and destination nodes. For example, in the case of source node and destination node 204, source/destination probability values for nodes 202/204 may be determined for all wires in portion 200 of routing resources 118.

In step 1025, if additional source or destination nodes remain to be selected, then the process returns to step 1015. In this regard, it will be appreciated that source node 200A and destination node 204B may be selected in the second iteration of step 1015. As a result, source/destination probability values for nodes 202A/204A may be determined for all wires in portion 200A of routing resources 118.

In step 1030, for each wire of routing resources 118, all source/destination probability values for each combination of source/destination nodes are added together to determine a wire congestion value for each wire e.g., in accordance with equation 2 previously discussed). For example, it will be appreciated that wires included in both of portions 200 and 200A will have two source/destination probability values: a first value for nodes 202/204, and a second value for nodes 202A/204A. For each of these wires, the first and second values are added together to obtain the wire congestion value.

In one embodiment, if the same source node may be connected to different destination nodes (e.g., as described in embodiments shown in FIGS. 8A-C and 9A-C), then the different source/destination probability values obtained for the same wire may not be not added together during step 1030. Rather, in such an embodiment, only the maximum source/destination probability value (e.g., the maximum source/destination probability value of all such values corresponding to source/destination combinations having a common source node) is added during step 1030 (e.g., in accordance with equation 1 previously discussed).

In step 1035, the wire congestion value determined for each wire may be used to estimate congestion density in various portions of routing resources 118 of PLD 100. For example, in one embodiment, the wire congestion values associated with wires located in a first region of PLD 100 (e.g., wires in portion 200 of FIG. 2) may be added together to provide a congestion density estimate for the first region. Also, the wire congestion values associated with wires located in a second region of PLD 100 (e.g., wires in portion 200B of FIG. 2) may be added together to provide a congestion density estimate for the second region. By comparing the congestion density estimates in the different regions (e.g., portions 200 and 200B), the relative congestion density of such regions may be determined with respect to each other and/or other regions of routing resources 118 of PLD 100.

Figure 11:
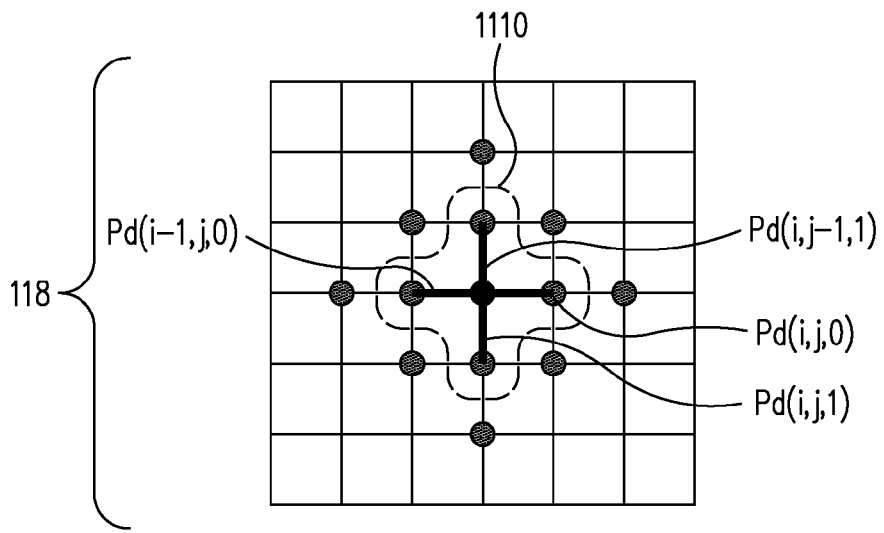
FIGS. 11-12 illustrate regions of routing resources of a PLD in accordance with embodiments of the present invention.

In various embodiments, such regions may correspond to any desired portion of routing resources. For example, in one embodiment, the congestion density D(c,r) of a region 1110 of routing resources 118 centered around a node (i,j) in FIG. 11 may be determined using the following equation 3, where c and r identify columns and rows, respectively:

$$D(c,r) = P_d(i,j,0) + P_d(i,j,1) + P_d(i-1,j,0) + P_d(i,j-1,1) \quad \text{(equation 3)}$$

Figure 12:
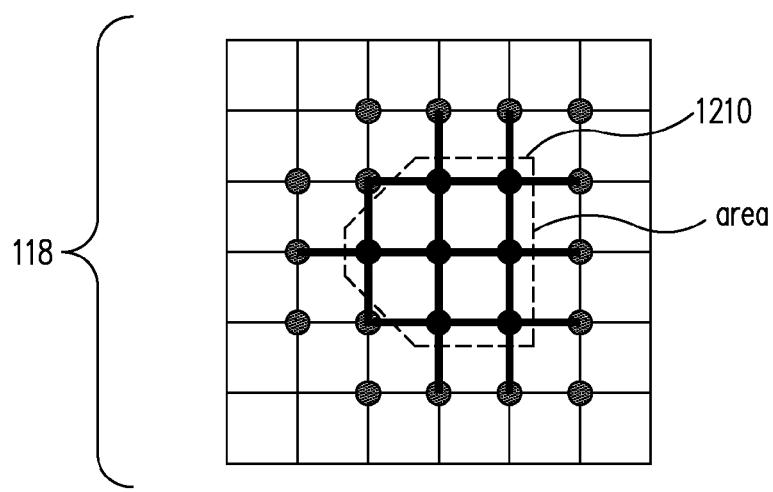

In another embodiment, the congestion density Da(c,r) of a region 1210 of routing resources 118 corresponding to an area of routing resources 118 in FIG. 12 may be determined using the following equation 4, where c and r identify columns and rows, respectively, d1 identifies portions of routing resources 118 connected to region 1210 through signal paths, and d2 identifies portions of routing resources 118 within region 1210:

$$Da(c,r) = \Sigma P_{d1}(i,j,k) + \Sigma P_{d2}(i,j,k) \quad \text{(equation 4)}$$

Embodiments described above illustrate but do not limit the invention. It should also be understood that numerous modifications and variations are possible in accordance with the principles of the present invention. Accordingly, the scope of the invention is defined only by the following claims.

We claim:

1. A computer-implemented method of estimating signal congestion in routing resources of a programmable logic device (PLD), wherein the routing resources comprise a plurality of nodes and a plurality of wires which may be selectively interconnected to provide a plurality of signal paths through the PLD, the method comprising:
    determining in a computing device a plurality of wire congestion values, wherein each of the wire congestion values identifies a relative likelihood of a corresponding one of the wires being used to provide the signal paths in comparison with the other wires;
    detecting in the computing device a selection of a first region of the routing resources;
    determining in the computing device a first congestion density estimate for the first region using the wire congestion values associated with the wires of the first region;
    detecting in the computing device a selection of a second region of the routing resources;

determining in the computing device a second congestion density estimate for the second region using the wire congestion values associated with the wires of the second region; and comparing the first and second congestion density estimates to determine the relative congestion density of the first and second regions.

2. The method of claim 1, wherein the determining a congestion density estimate for a region comprises summing the wire congestion values associated with the wires of the region.

3. The method of claim 1, wherein the signal paths connect a plurality of source nodes to a plurality of destination nodes, wherein the determining wire congestion values comprises:

identifying a plurality of combinations of the source nodes and the destination nodes, wherein each combination includes at least one of the source nodes and at least one of the destination nodes;

for each combination, determining a plurality of probability values, wherein each of the probability values identifies a probability of a corresponding one of the wires being used to connect the source node to the destination node; and for each wire, summing all of the probability values associated with the wire to determine the wire congestion value for the wire.

4. The method of claim 3, wherein the probability values are source/destination probability values, wherein the determining probability values comprises:

selecting a plurality of subsets of the routing resources, wherein each subset may be used to provide at least a portion of one of the signal paths from the source node to the destination node, wherein each subset comprises a root node, a trunk node, and a trunk wire connecting the root node to the trunk node;

determining a plurality of intermediate probability values, wherein each of the intermediate probability values identifies a probability of a corresponding one of the trunk wires being used by any of the signal paths that also include one or more other wires of the routing resources connected between the trunk wire and the source node; and for each trunk wire, summing all intermediate probability values associated with the trunk wire to determine the source/destination probability value associated with the trunk wire.

5. The method of claim 4, wherein each of the subsets further comprises a branch wire connected to the trunk node, wherein the determining intermediate probability values further comprises:

determining a plurality of branch probability values, wherein each of the branch probability values identifies a probability of a corresponding one of the branch wires being used by any of the signal paths that also include the trunk node of the same subset; and determining the intermediate probability values using the branch probability values.

6. The method of claim 3, wherein the source and destination nodes correspond to components of the PLD specified in a configuration of the PLD.

7. A non-transitory computer readable medium on which are stored computer readable instructions for performing the steps of claim 1.

8. A system comprising:
one or more processors, and
one or more memory devices adapted to store a plurality of computer readable instructions which when executed by the one or more processors are adapted to cause the system to perform a computer-implemented method of estimating signal congestion in routing resources of a programmable logic device (PLD), wherein the routing resources comprise a plurality of nodes and a plurality of wires which may be selectively interconnected to provide a plurality of signal paths through the routing resources of the PLD, the method comprising:

determining a plurality of wire congestion values, wherein each of the wire congestion values identifies a relative likelihood of a corresponding one of the wires being used to provide the signal paths in comparison with the other wires;

detecting a selection of a first region of the routing resources;

determining a first congestion density estimate for the first region using the wire congestion values associated with the wires of the first region;

detecting a selection of a second region of the routing resources;

determining in the computing device a second congestion density estimate for the second region using the wire congestion values associated with the wires of the second region; and comparing the first and second congestion density estimates to determine the relative congestion density of the first and second regions.

9. The system of claim 8, wherein the determining a congestion density estimate for a region comprises summing the wire congestion values associated with the wires of the region.

10. The system of claim 8, wherein the signal paths connect a plurality of source nodes to a plurality of destination nodes, wherein the determining wire congestion values comprises:

identifying a plurality of combinations of the source nodes and the destination nodes, wherein each combination includes at least one of the source nodes and at least one of the destination nodes;

for each combination, determining a plurality of probability values, wherein each of the probability values identifies a probability of a corresponding one of the wires being used to connect the source node to the destination node; and for each wire, summing all of the probability values associated with the wire to determine the wire congestion value for the wire.

11. The system of claim 10, wherein the probability values are source/destination probability values, wherein the determining probability values comprises:

selecting a plurality of subsets of the routing resources, wherein each subset may be used to provide at least a portion of one of the signal paths from the source node to the destination node, wherein each subset comprises a root node, a trunk node, and a trunk wire connecting the root node to the trunk node;

determining a plurality of intermediate probability values, wherein each of the intermediate probability values identifies a probability of a corresponding one of the trunk wires being used by any of the signal paths that also include one or more other wires of the routing resources connected between the trunk wire and the source node; and for each trunk wire, summing all intermediate probability values associated with the trunk wire to determine the source/destination probability value associated with the trunk wire.

12. The system of claim 11, wherein each of the subsets further comprises a branch wire connected to the trunk node, wherein the determining intermediate probability values further comprises:

determining a plurality of branch probability values, wherein each of the branch probability values identifies a probability of a corresponding one of the branch wires being used by any of the signal paths that also include the trunk node of the same subset; and determining the intermediate probability values using the branch probability values.

13. A non-transitory computer readable medium on which are stored computer readable instructions for performing in a computing device a method of estimating signal congestion in routing resources of a programmable logic device (PLD), wherein the routing resources comprise a plurality of nodes and a plurality of wires which may be selectively interconnected to provide a plurality of signal paths through the PLD, the method comprising determining a plurality of wire congestion values, wherein each of the wire congestion values identifies a relative likelihood of a corresponding one of the wires being used to provide the signal paths in comparison with the other wires;

detecting a selection of a first region of the routing resources;

determining a first congestion density estimate for the first region using the wire congestion values associated with the wires of the first region;

detecting a selection of a second region of the routing resources;

determining a second congestion density estimate for the second region using the wire congestion values associated with the wires of the second region; and comparing the first and second congestion density estimates.

* * * * *